(12) United States Patent
Lin et al.

(10) Patent No.: US 11,856,744 B2
(45) Date of Patent: Dec. 26, 2023

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Hsiao Wen Lee, Hsinchu (TW); Chih-Han Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 40 days.

(21) Appl. No.: 17/460,101

(22) Filed: Aug. 27, 2021

(65) Prior Publication Data

US 2023/0069279 A1    Mar. 2, 2023

(51) Int. Cl.
| | |
|---|---|
| *H10B 10/00* | (2023.01) |
| *H01L 27/092* | (2006.01) |
| *H01L 29/08* | (2006.01) |
| *H01L 29/66* | (2006.01) |
| *H01L 21/8238* | (2006.01) |
| *H01L 29/417* | (2006.01) |

(52) U.S. Cl.
CPC ..... *H10B 10/12* (2023.02); *H01L 21/823814* (2013.01); *H01L 21/823821* (2013.01); *H01L 21/823878* (2013.01); *H01L 27/0924* (2013.01); *H01L 29/0847* (2013.01); *H01L 29/41791* (2013.01); *H01L 29/6681* (2013.01)

(58) Field of Classification Search
CPC ............ H10B 10/12; H01L 21/823814; H01L 21/823821; H01L 21/823878; H01L 27/0924; H01L 29/0847; H01L 29/41791; H01L 29/6681

See application file for complete search history.

(56) References Cited

U.S. PATENT DOCUMENTS

| | | | | |
|---|---|---|---|---|
| 9,455,331 | B1* | 9/2016 | Cai | H01L 27/0207 |
| 2016/0233298 | A1* | 8/2016 | Webb | H01L 29/66545 |
| 2019/0305112 | A1* | 10/2019 | Subramanian | H01L 29/66545 |
| 2019/0326287 | A1* | 10/2019 | Liaw | H01L 29/0653 |
| 2020/0043935 | A1* | 2/2020 | Liaw | H01L 29/785 |
| 2020/0098764 | A1* | 3/2020 | Wang | H01L 21/762 |

* cited by examiner

*Primary Examiner* — Karen Kusumakar
*Assistant Examiner* — Adam S Bowen
(74) *Attorney, Agent, or Firm* — FOLEY & LARDNER LLP

(57) ABSTRACT

A semiconductor device includes a first semiconductor fin extending along a first direction. The semiconductor device includes a second semiconductor fin also extending along the first direction. The semiconductor device includes a dielectric fin disposed between the first and second semiconductor fins, wherein the dielectric fin also extends along the first direction. The semiconductor device includes a gate structure extending along a second direction perpendicular to the first direction, the gate structure comprising a first portion and a second portion. A top surface of the dielectric fin is vertically above respective top surfaces of the first and second semiconductor fins. The first portion and the second portion are electrically isolated by the dielectric fin. The first portion of the gate structure overlays an edge portion of the first semiconductor fin, and the second portion of the gate structure overlays a non-edge portion of the second semiconductor fin.

19 Claims, 22 Drawing Sheets

SEMICONDUCTOR DEVICES AND METHODS OF MANUFACTURING THEREOF

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
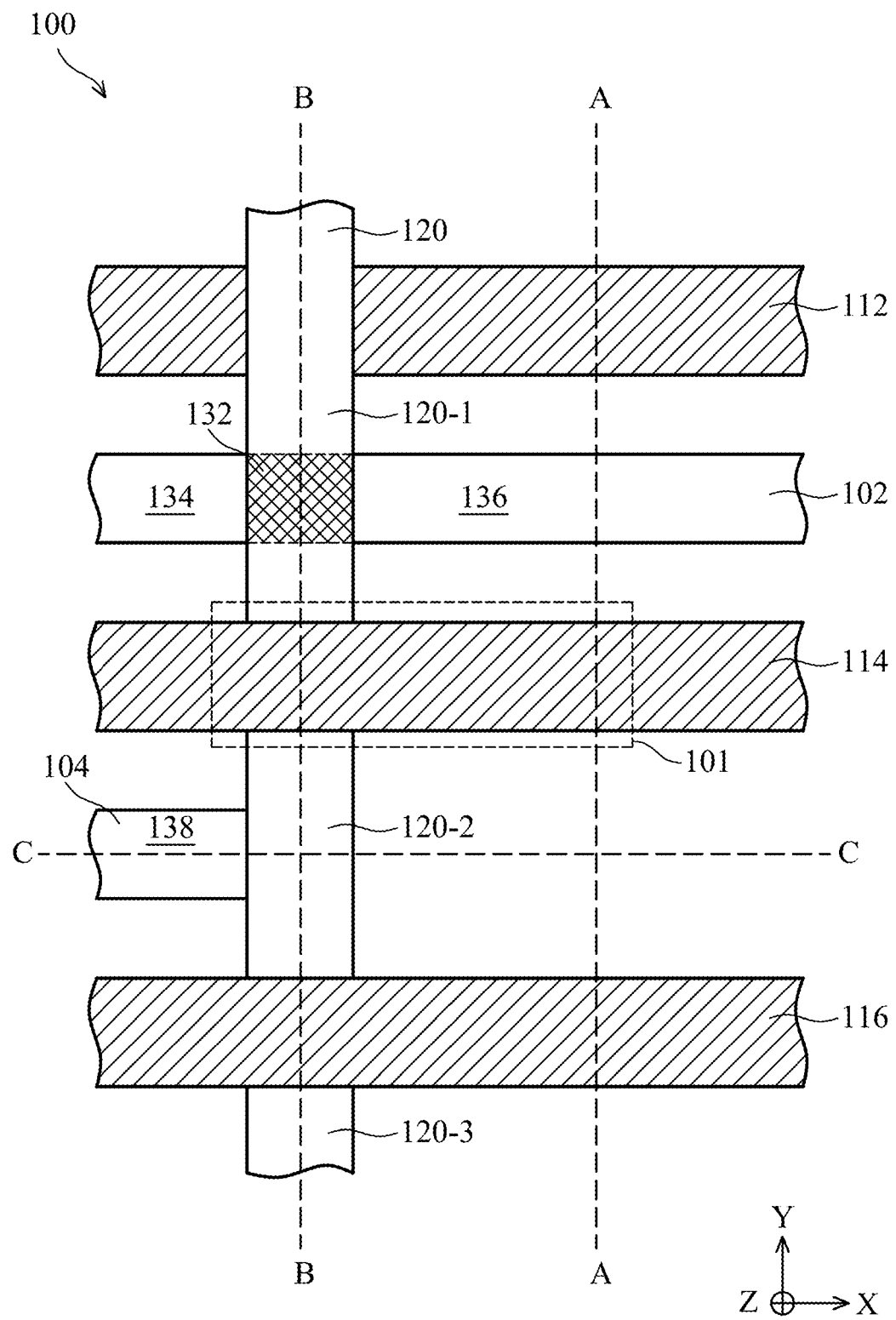
FIG. 1A illustrates a top view of a semiconductor device including a dummy fin structure separating a PODE and a non-PODE, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit typically includes a large number of devices (e.g., transistors). To fabricate these devices, a number of (e.g., planar and/or non-planar) active regions and a number of gate structures that intersect the active regions can be formed on a substrate or wafer to define such devices. To further configure those device to operate as certain circuits, some of the devices can be operatively connected to or disconnected from each other. For example, a gate structure can be cut or otherwise disconnected following the formation of a corresponding dummy gate structure or following the formation of the gate structure. Given the large number of transistors formed on the substrate, the number of gate structures to be cut may increase accordingly, which sometimes causes issues. For example, when the number of to-be-cut gate structures increases above a threshold (e.g., 4 gate structures), a discrepancy of profiles and dimensions among those gate structures can occur, which can cause one or more of the gate structures to be undesirably connected to a source/drain region or a corresponding contact.

Embodiments of the present disclosure are discussed in the context of forming non-planar devices (e.g., FinFET devices), and in particular, in the context of forming one or more isolation structures (e.g., dummy fin structures) between some of the devices. Different from the existing technologies, the dummy fin structures may each be formed between adjacent active regions (sometimes referred to as active fin structures, or active channels), prior to the formation of (e.g., either dummy or active) gate structures. Further, the dummy fin structures may be formed higher than the active fin structures. In some embodiments, the dummy fin structures may have a top surface coplanar with a top surface of the later formed gate structures. As such, some of the gate structures can be "spontaneously" cut or disconnected into different portions, upon being formed. By using the method, as disclosed herein, even though the number of gate structures to be cut is large, the above-identified discrepancy issues, which typically results from different etching conditions (e.g., different etching rates), can be advantageously avoided.

Further, in advanced technology nodes, some of the active fin structures may be cut or otherwise disconnected for facilitating the overall design of an integrated circuit. As such, a portion of some of the gate structures, in addition to overlaying a top surface of the cut active fin structure, may extend along an edge of the cut active fin structure. Such a portion of the gate structure that extends along the edge of a cut active fin structure may sometimes be referred to as a poly-oxide diffusion-edge (PODE), and the portion of the gate structure that does not extend along the edge of a cut active fin structure may sometimes be referred to as a non-poly-oxide diffusion-edge (non-PODE). In the existing technologies, it is typically selected not to cut such PODE and non-PODE, as the above-identified gate-contact short issue may occur. This can disadvantageously constrain flexibility of the overall design. Using the disclosed method to spontaneously cut the PODE and non-PODE, however, can avoid the issue.

FIG. 1A illustrates a top view of an example semiconductor device 100 that includes the disclosed dummy fin structure separating a PODE and a non-PODE, in accordance with various embodiments. As shown, the semiconductor device 100 includes: active regions 102 and 104 that extend along a first lateral direction (e.g., the X direction); dummy regions 112, 114, and 116 that also extend along the X direction; and a gate structure 120 that extends along a second lateral direction (e.g., the Y direction).

The active regions 102-104 and gate structures 120 can define one or more planar or non-planar transistors. For example, the semiconductor device 100 can include a number of FinFETs. It should be understood that the semiconductor device can include any of various other transistors (e.g., gate-all-around (GAA) transistors, nanosheet transistors, nanowire transistors, etc.), while remaining within the scope of the present disclosure.

When the transistors are implemented as FinFETs, each of the active regions 102-104 is formed as a three-dimensional fin structure protruding from a substrate. Accordingly, the active regions 102-104 may sometimes be referred to as active fin structures 102-104, respectively. Similarly, each of the dummy regions 112-116 is formed as a three-dimensional fin structure protruding from a substrate. Accordingly, the dummy regions 112-116 may sometimes be referred to as dummy fin structures 112-116, respectively. In some embodiments, the dummy fin structures 112-116 are each formed to upwardly extend higher than the active fin structures 102-104. Further, adjacent active fin structures 102-104 are separated by one of the dummy fin structures 112-116.

The gate structure 120, which may be a metal gate structure (sometimes referred to as an active gate structure), is formed to straddle the active fin structures 102-104. Further, the gate structure 120 can either straddle or be cut by the dummy fin structures. For example, the gate structure 120 straddles the active fin structures 102-104 and the dummy fin structure 112, and is cut by the dummy fin structures 114 and 116. As shown in FIG. 1A, the gate structure 120 is cut (by the dummy fin structures 114 and 116, respectively) into three separate portions, 120-1, 120-2, and 120-3. In some embodiments, one or more of the active fin structures can be cut or disconnected. For example, the active fin structure 104 may be cut around the gate structure 120. Accordingly, in addition to straddling the active fin structure 104 (like other portions of the gate structure 120), the portion 120-2 can further extend along an edge of such a cut active fin structure 104. Based on the above definition, the portions 120-1, 120-2, and 120-3 may sometimes be referred to as non-PODE 120-1, PODE 120-2, and non-PODE 120-3, respectively.

Each of the active regions 102-104 can be configured to form one or more channels and one or more source/drain structures. For example, a channel 132, straddled by the non-PODE 120-1, can be formed in the active fin structure 102; and source/drain structures 134 and 136, not straddled by any gate structure or gate structure portion, can be formed in the active fin structure 102 on opposite sides of the channel 132. In another example, even though an edge portion of the active fin structure 104 is straddled by the portion 120-2, which is a PODE, this edge portion may not function as a channel. However, a source/drain structure 138, not straddled by any gate structure or gate structure portion, can be formed in the active fin structure 104 on a side of the PODE 120-2.

Figure 1B:
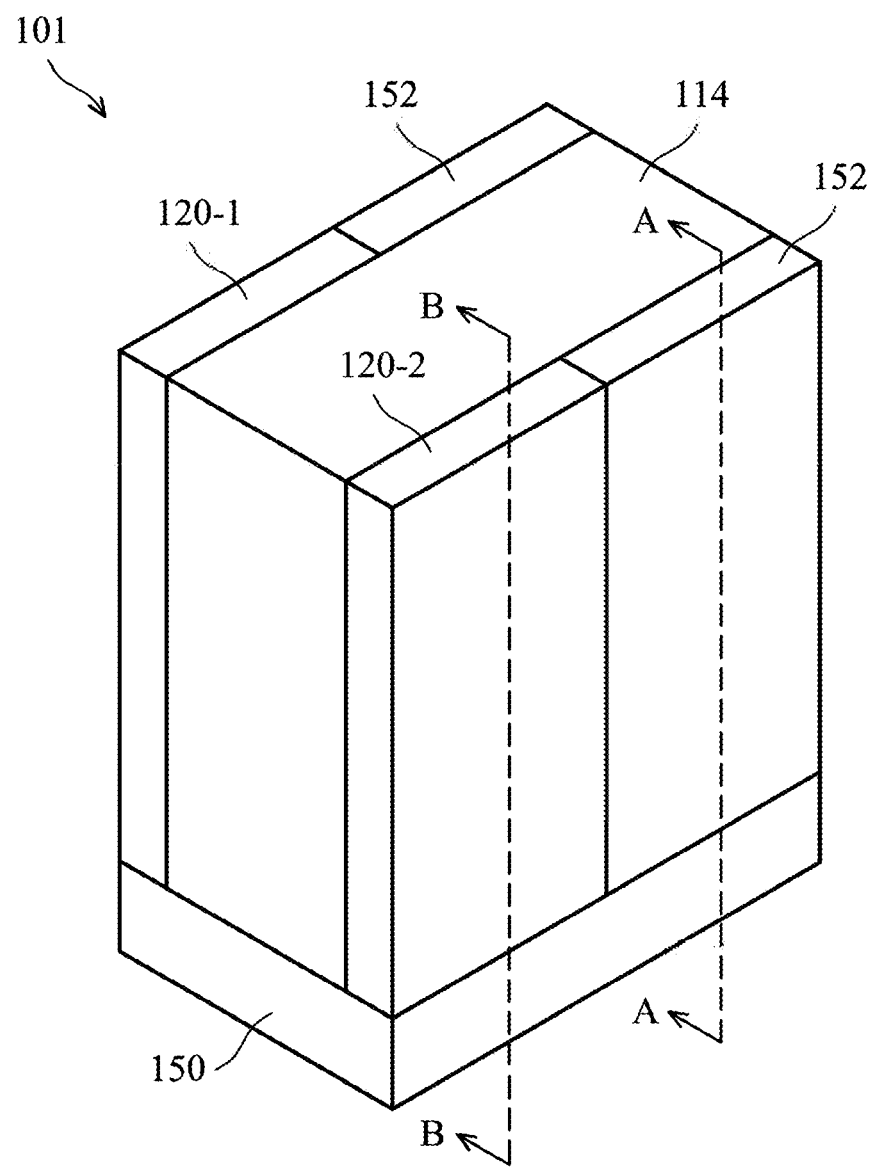
FIG. 1B illustrates a perspective view of a portion of the semiconductor device of FIG. 1A, in accordance with some embodiments.

For purposes of clarification, FIG. 1B illustrates a perspective view of a portion (e.g., 101) of the example semiconductor device 100 shown in FIG. 1A, in accordance with various embodiments. As shown, the dummy fin structure 114 that separates the non-PODE 120-1 and PODE 120-2 is formed on a shallow trench isolation (STI) structure 150. To separate the non-PODE 120-1 and PODE 120-2, the dummy fin structure 114, upon being formed, may be formed to have a same or similar height as (e.g., dummy) gate structure portions that are replaced with respective portions of the active gate structure 120, in some embodiments. Further, the semiconductor device 100 includes an interlayer dielectric (ILD) 152 formed on sides of the dummy fin structure 114 where no active gate structure is formed, which will be discussed in further detail below.

FIG. 1A (and FIG. 1B) are provided as a reference to illustrate a number of cross-sections in subsequent figures. For example, cross-section B-B extends along a longitudinal axis of the gate structure 120; cross-section A-A extends in parallel with cross-section B-B and crosses the source/drain structure 136; and cross-section C-C is perpendicular to cross-section A-A/B-B and is along a longitudinal axis of the active fin structure 104. Subsequent figures refer to these reference cross-sections for clarity.

Figure 2:
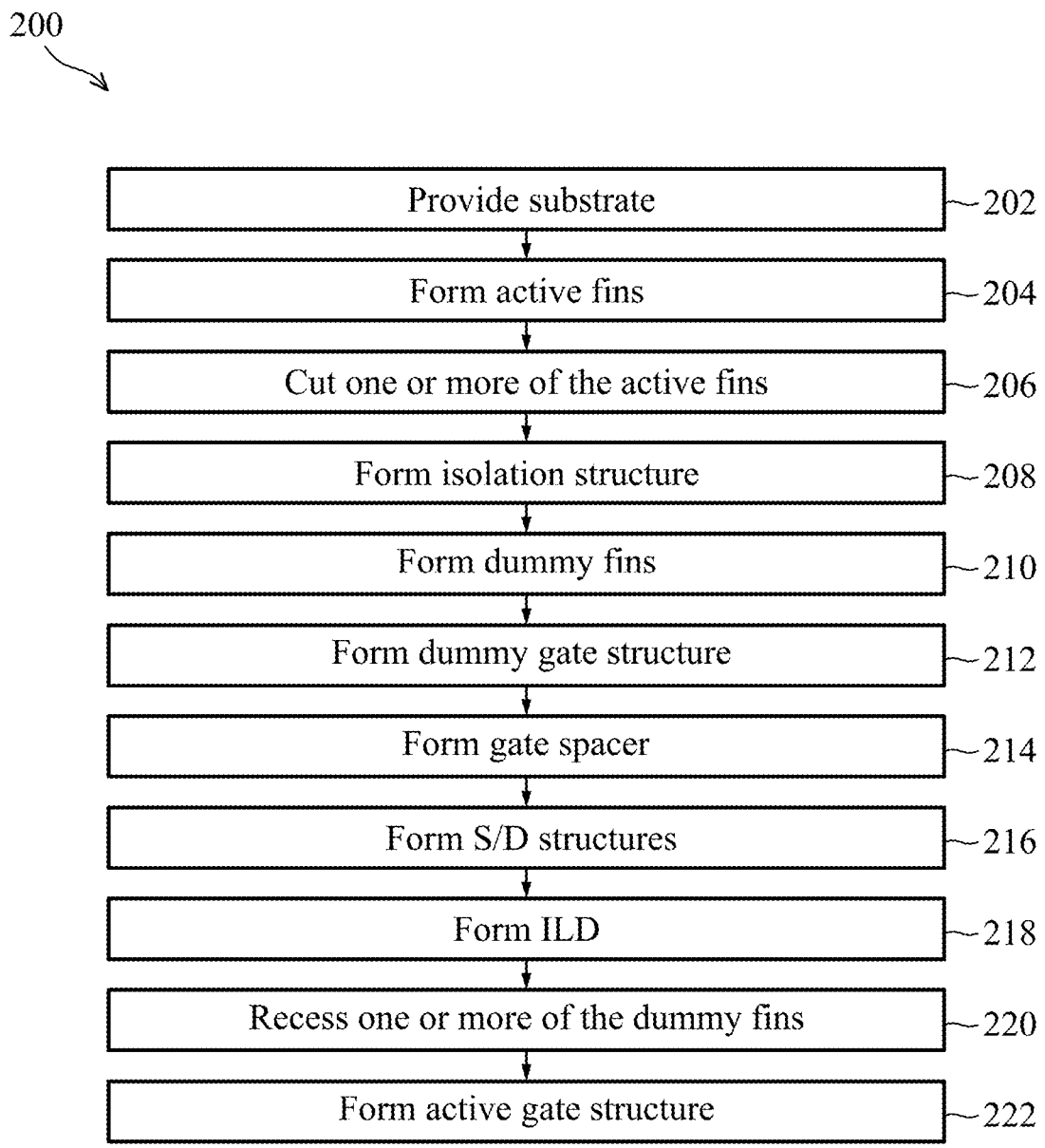
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., semiconductor device 100). However, it should be understood that the method 200 can be used to form a nanosheet transistor device, a nanowire transistor device, a vertical transistor device, a gate-all-around (GAA) transistor device, or the like, while remaining within the scope of the present disclosure. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8A, 8B, 9A, 9B, 9C, 10, 11, 12, 13, 14, 15A, and 15B, respectively, which will be discussed in further detail below.

In brief overview, the method 200 starts with operation 202 of providing a substrate. The method 200 continues to operation 204 of forming a number of active fins. The method 200 continues to operation 206 of cutting one or more of the active fins. The method 200 continues to operation 208 of forming an isolation structure. The method 200 continues to operation 210 of forming a number of dummy fins. The method 200 continues to operation 212 of forming a dummy gate structure over the active fins. The method 200 continues to operation 214 of forming a gate spacer. The method 200 continues to operation 216 of growing source/drain structures. The method 200 continues to operation 218 of forming an interlayer dielectric (ILD). The method 200 continues to operation 220 of recessing one or more of the dummy fins. The method 200 continues to operation 222 of forming an active gate structure.

Figure 3:
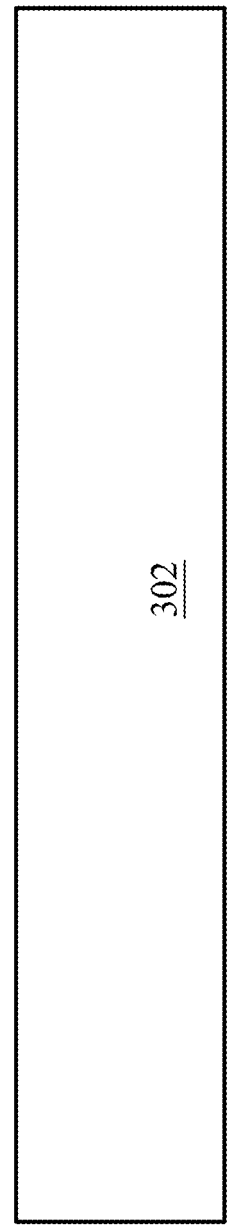
FIGS. 3, 4, 5, 6, 7, 8A, 8B, 9A, 9B, 9C, 10, 11, 12, 13, 14, 15A, and 15B illustrate cross-sectional views of an example FinFET device (or a portion of the example FinFET device) during various fabrication stages, made by the method of FIG. 3, in accordance with some embodiments.

Corresponding to operation 202 of FIG. 2, FIG. 3 is a cross-sectional view of the FinFET device 300 including a semiconductor substrate 302 at one of the various stages of fabrication. The cross-sectional view of FIG. 3 is cut along the lengthwise direction of an active/dummy gate structure of the FinFET device 300 (e.g., cross-section B-B indicated in FIGS. 1A-B).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
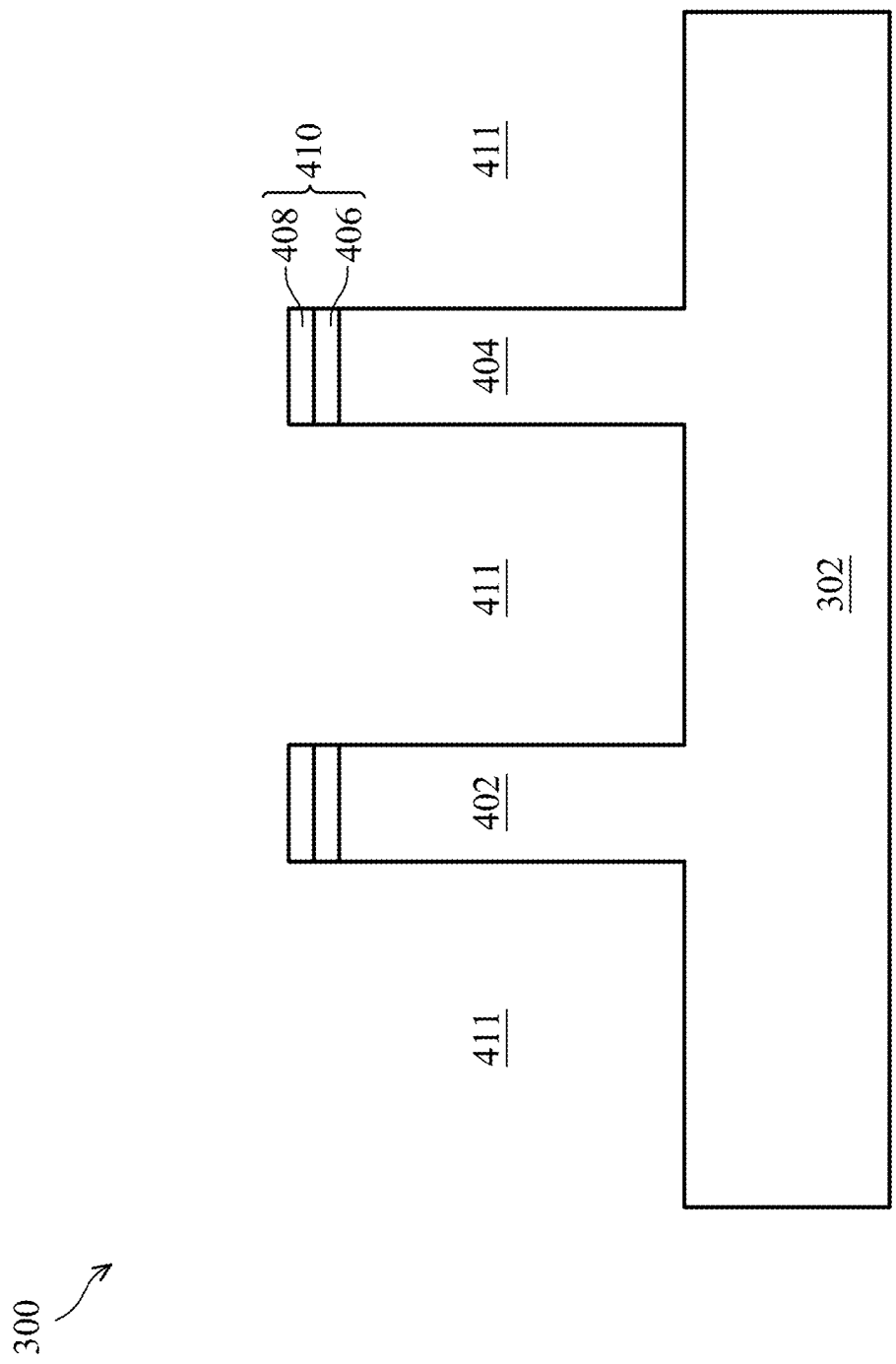

Corresponding to operation 204 of FIG. 2, FIG. 4 is a cross-sectional view of the FinFET device 300 including semiconductor fins 402 and 404 at one of the various stages of fabrication. The cross-sectional view of FIG. 4 is cut along the lengthwise direction of an active/dummy gate structure of the FinFET device 300 (e.g., cross-section B-B indicated in FIGS. 1A-B). In some embodiments, the semiconductor fins 402 and 404 may correspond to the active regions 102 and 104 shown in FIG. 1A, respectively.

The semiconductor fins 402-404 may be each configured as an active fin (structure), which will be adopted as an active (e.g., electrically functional) fin or channel in a respective completed FinFET. Hereinafter, the semiconductor fins 402 and 404 may sometimes be referred to as "active fins 402 and 404," respectively. Although two semiconductor fins are shown in the illustrated example, it should be appreciated that the FinFET device 300 can include any number of semiconductor fins while remaining within the scope of the present disclosure.

The semiconductor fins 402-404 are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining the active fins 402-404 between adjacent trenches 411 as illustrated in FIG. 4. When multiple fins are formed, such a trench may be disposed between any adjacent ones of the fins. In some embodiments, the active fins 402-404 are formed by etching trenches in the substrate 302 using, for example, reactive ion etch (RIE), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the active fins 402-404.

The active fins 402-404 may be patterned by any suitable method. For example, the active fins 402-404 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 3 and 4 illustrate an embodiment of forming the active fins 402-404, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the active fins 402-404 that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the active fins 402-404 may include silicon germanium ($Si_xGe_{1-x}$, where x can be between 0 and 1), silicon carbide, pure silicon, pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
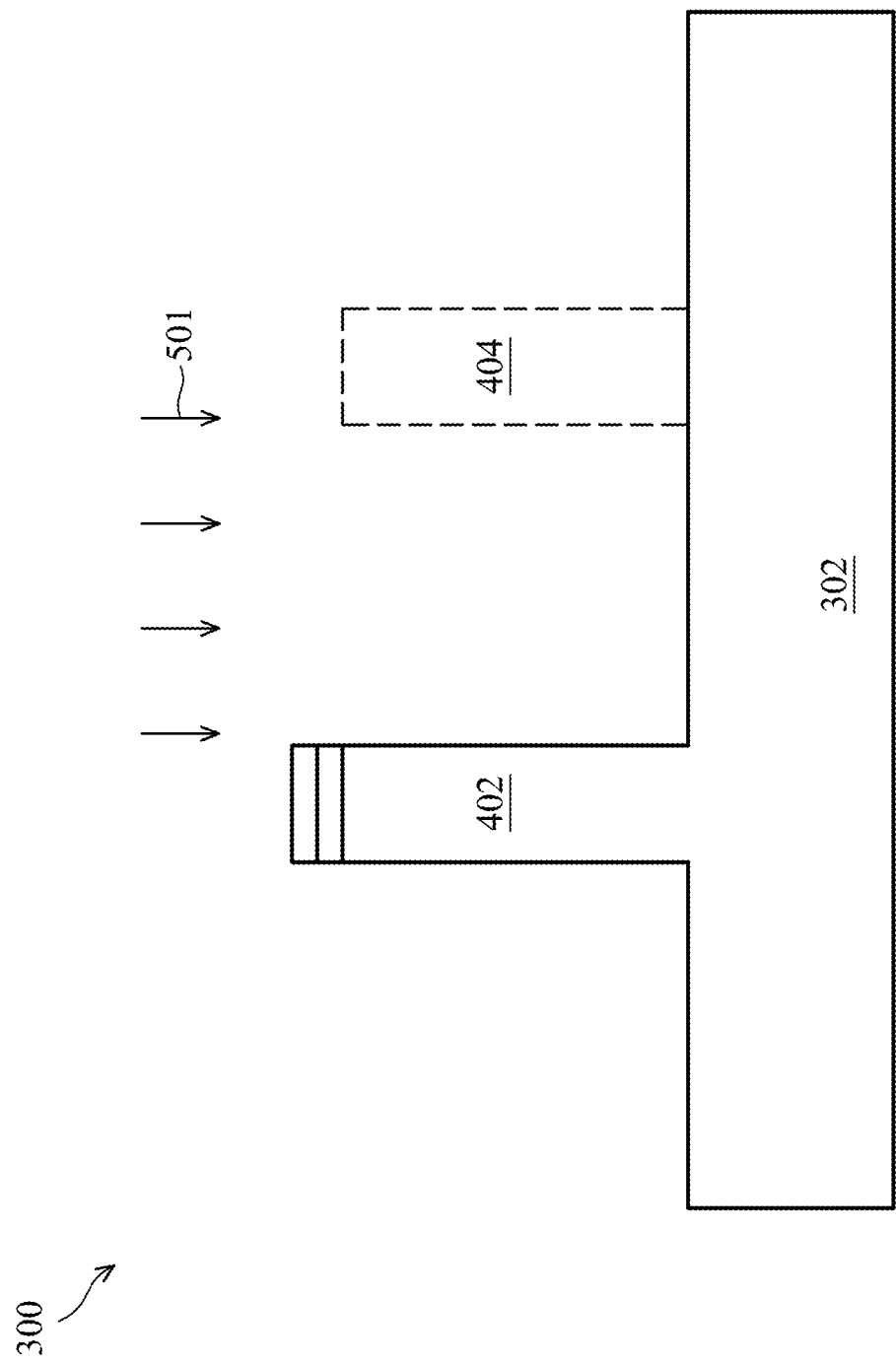

Corresponding to operation 206 of FIG. 2, FIG. 5 is a cross-sectional views of the FinFET device 300 in which one of the active fins 404 is cut or otherwise discontinued at one of the various stages of fabrication. The cross-sectional view of FIG. 5 is cut along a direction in parallel with the lengthwise direction of an active/dummy gate structure of the FinFET device 300 (e.g., cross-section A-A indicated in FIGS. 1A-B).

An etching process 501 may be performed to remove a portion of the active fin 404, which is enclosed by a dotted line in FIG. 5. Such a removed portion of the active fin 404 can be referenced to the top view of FIG. 1A, e.g., the portion of the active region 104 on the right-hand side of the gate structure 120. This cut active fin 404 (i.e., with one or more of its portions removed) can be better appreciated in the following figures that are cut along cross-section C-C. In accordance with various embodiments, the etching process 501 can remove the portion of the active fin 404, while covering the active fin 402. Thus, the active fin 402 may remain substantially intact, e.g., continuously extending from one point to the other point on the substrate 302. By contrast, the active fin 404, which may continuously extend between the same points as the active fin 402 (upon being formed in operation 204), may be cut into a number of discontinuous portions, one of which is shown in FIG. 1A.

For example, the etching process 501 can include a plasma etching process. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof.

Figure 6:
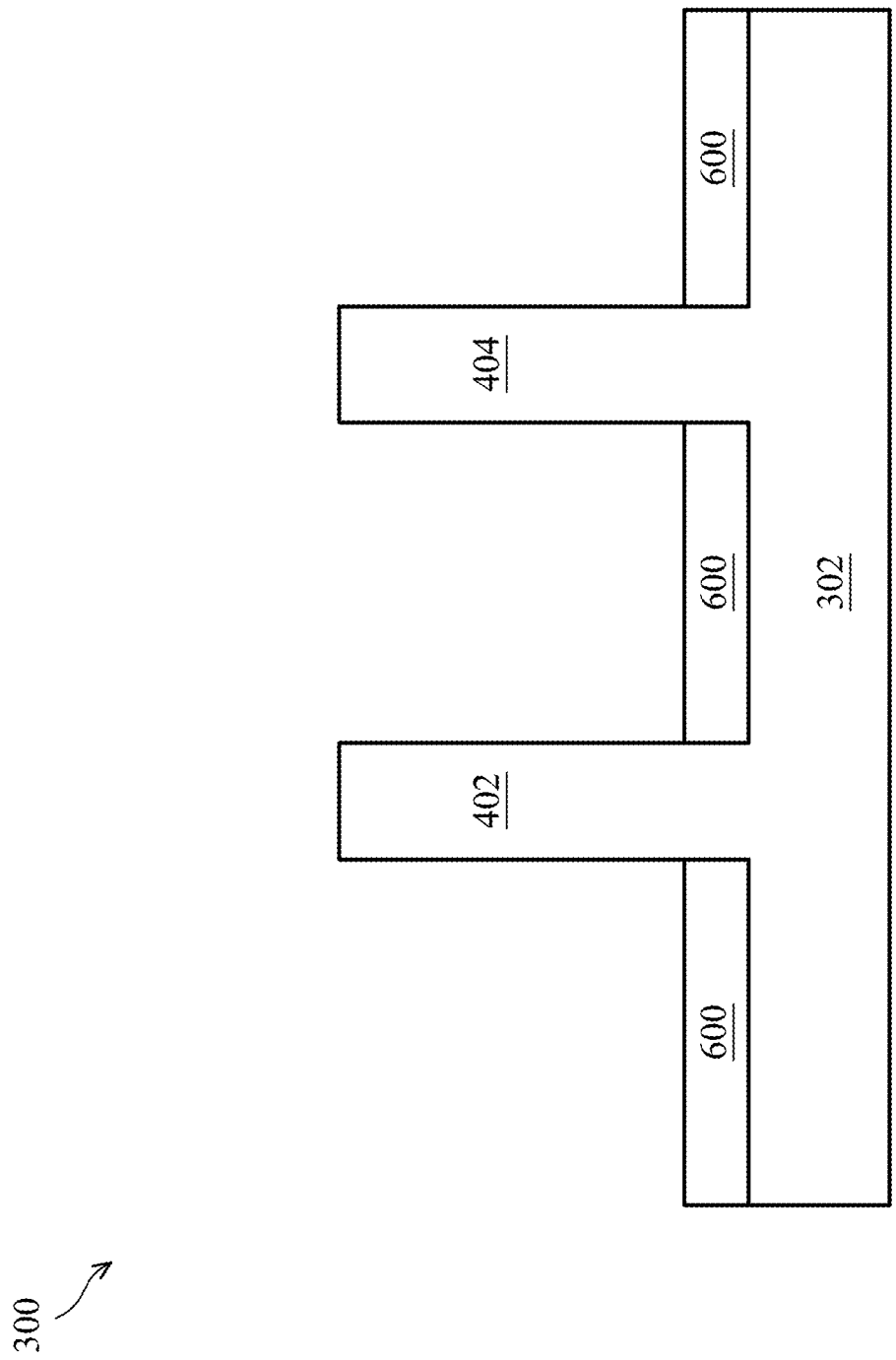

Corresponding to operation 208 of FIG. 2, FIG. 6 is a cross-sectional view of the FinFET device 300 including an isolation region/structure 600 at one of the various stages of fabrication. The cross-sectional view of FIG. 6 is cut along the lengthwise direction of an active/dummy gate structure of the FinFET device 300 (e.g., cross-section B-B indicated in FIGS. 1A-B). It is noted that FIG. 6 (and the following cross-sectional views) is not cut along cross-section A-A, so that the cut active fin 404 (i.e., the remaining portions of the active fin 404) is still visible.

The isolation structure 600, which is formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form top surfaces of the isolation structure 600 and a top surface of the fins 402-404 that are coplanar (not shown). The patterned mask 410 (FIG. 4) may also be removed by the planarization process.

In some embodiments, the isolation structure 600 includes a liner, e.g., a liner oxide (not shown), at the interface between the isolation structure 600 and the substrate 302 (active fins 402-404). In some embodiments, the liner oxide is formed to reduce crystalline defects at the interface between the substrate 302 and the isolation structure 600. Similarly, the liner oxide may also be used to reduce crystalline defects at the interface between the active fins 402-404 and the isolation structure 600. The liner oxide (e.g., silicon oxide) may be a thermal oxide formed through a thermal oxidation of a surface layer of the substrate 302, although other suitable method may also be used to form the liner oxide.

Next, the isolation structure 600 is recessed to form shallow trench isolations (STIs) 600, as shown in FIG. 6. The isolation structure 600 is recessed such that the upper portions of the active fins 402-404 protrude from between neighboring STIs 600. Respective top surfaces of the STIs 600 may have a flat surface (as illustrated), a convex surface, a concave surface (such as dishing), or combinations thereof. The top surfaces of the STIs 600 may be formed flat, convex, and/or concave by an appropriate etch. The isolation structure 600 may be recessed using an acceptable etching process, such as one that is selective to the material of the isolation structure 600. For example, a dry etch or a wet etch using dilute hydrofluoric (DHF) acid may be performed to recess the isolation structure 600.

Figure 7:
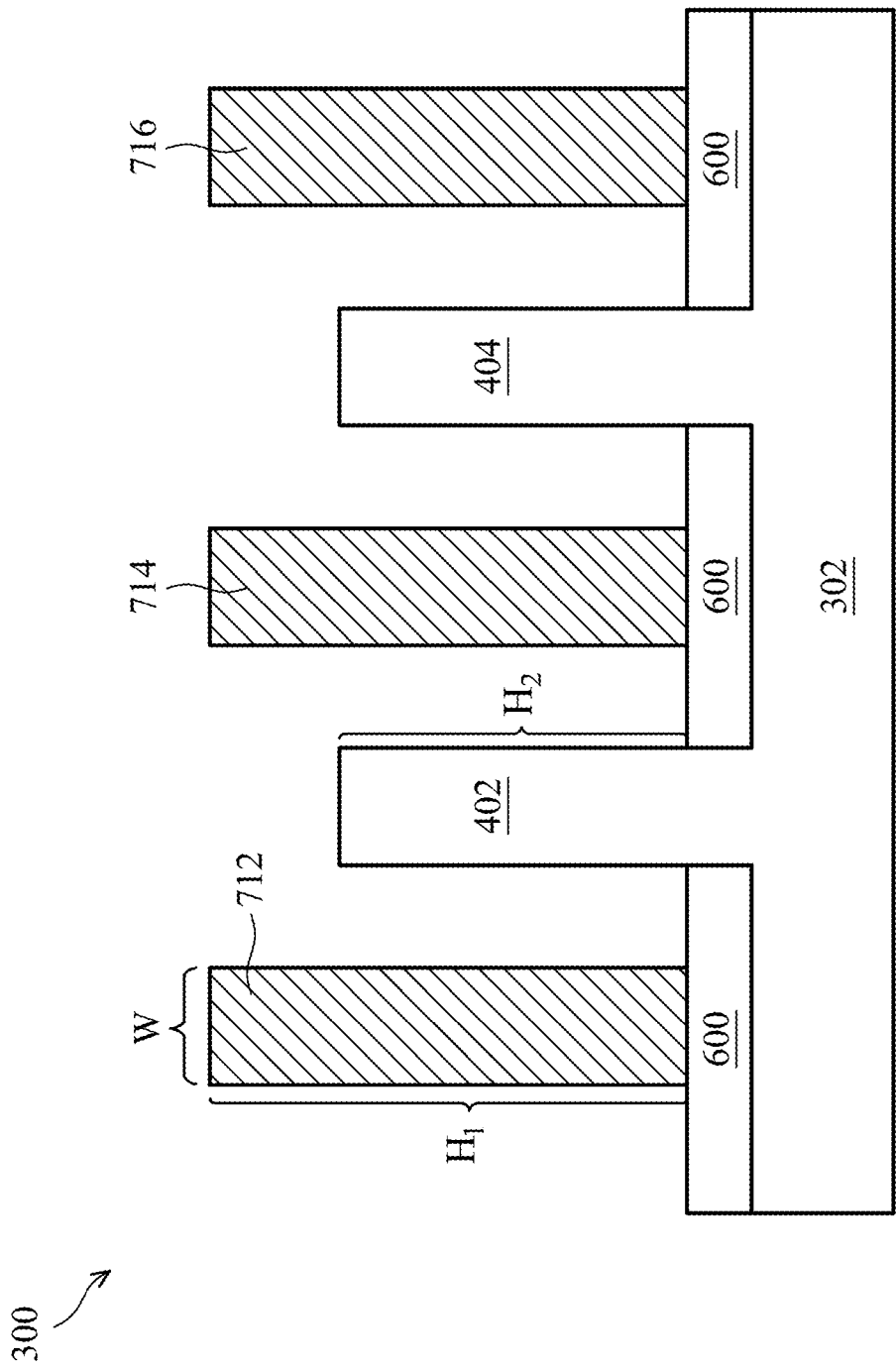

Corresponding to operation 210 of FIG. 2, FIG. 7 is a cross-sectional views of the FinFET device 300 including dummy fins (structures) 712, 714, and 716 at one of the various stages of fabrication. The cross-sectional view of FIG. 7 is cut along the lengthwise direction of an active/dummy gate structure of the FinFET device 300 (e.g., cross-section B-B indicated in FIG. 1). In some embodiments, the dummy fins 712, 714, and 716 may correspond to the dummy fins 112, 114, and 116 shown in FIG. 1A, respectively.

In advanced processing nodes, such a dummy fin can be disposed next to one or more active fins (e.g., between two adjacent active fins) to improve the overall design and fabrication of a semiconductor device. For example, dummy fins can be used for optical proximity correction (OPC) to enhance a pattern density and pattern uniformity in the stage of designing the semiconductor device. In another example, adding dummy fins adjacent to active fins can improve chemical-mechanical polishing (CMP) performance when fabricating the semiconductor device. The dummy fin is designed to stay inactive or electrically non-functional, when the semiconductor device is appropriately configured and powered.

The dummy fins 712-716 may be formed concurrently with or subsequently to the formation of the isolation structure 600. As an example, after cutting the active fin 404 (FIG. 5), the insulation material of the isolation structure 600 may be deposited over the active fins 402-404 in a controlled deposition rate, thereby causing cavities to be spontaneously formed in the trenches 411. The cavities are then filled with a dielectric material of the dummy fin 712-716 (using low-pressure chemical vapor deposition (LPCVD) or plasma enhanced chemical vapor deposition (PECVD), for example), followed by a CMP process to form the dummy fins 712-716. The dielectric material, for example, may include silicon oxide, silicon nitride, silicon oxynitride, silicon carbide, silicon carbonitride, silicon oxycarbonitride, silicon oxycarbide, or combinations thereof. In another example, the dielectric material may include group IV-based oxide or group IV-based nitride, e.g., tantalum nitride, tantalum oxide, hafnium oxide, or combinations thereof. The insulation material (of the isolation structure 600) is then recessed to form the STIs 600. Using such a method to form the dummy fins 712-716, the dummy fins 712-716 are formed over the isolation structure 600, as shown in FIG. 7.

As another example, after depositing the insulation material of the isolation structure 600 over the active fins 402-404, a patterned mask may be formed over the isolation structure 600 to expose portions of the isolation structure 600 to form the dummy fins 712-716 (e.g., in the trenches 411). Subsequently, the exposed portions of the isolation structure 600 may be etched using, for example, reactive ion etch (RIE), neutral beam etch (NBE), the like, or combinations thereof, thereby defining cavities. The cavities are then filled with the dielectric material of the dummy fins (as described above), followed by a CMP process to form the dummy fins 712-716. The insulation material (of the isolation structure 600) is then recessed to form the STIs 600. As such, the dummy fins 712-716 are formed over the isolation structure 600, as shown in FIG. 7.

In accordance with various embodiments, the dummy fins 712-716 is formed to have a height, $H_1$, greater than a height of the active fins 402-404, $H_2$, both of which are measured from the top surface of the STIs 600, as shown in FIG. 7. Alternatively stated, the dummy fins 712-716 may outwardly extend from the substrate 302 farther than the active fins 402-404. As a non-limiting example, $H_1$ may range between about 10 nm and about 200 nm, and $H_2$ may range between about 5 nm and about 150 nm. Further, the dummy fins 712-716 may each have a width, W, which can range between about 2 nm and 500 nm, for example. In some embodiments, the height ($H_1$) of the dummy fins 712-716 may be similar as the height of a dummy gate structure, which will be discussed below. Forming such a higher dummy fins, the dummy gate structure can be spontaneously divided or otherwise separated into a number of different portions. The higher dummy fins 712-716 can be formed by performing a selective etching process on the active fins 402-404. For example, following the CMP process (to form the dummy fins 712-716), an etching process selective to remove the active fins more than the dummy fins (using etchants such as, for example, $Cl_2$, HBr, $CF_4$, $CHF_3$, $CH_2F_2$, $CH_3F$, $C_4F_6$, $BCl_3$, $SF_6$, $NF_3$) is performed.

By forming the dummy fins using the above-described method(s), the dummy fins 712-716 may each contain a continuously formed one-piece structure. For example, each of the dummy fins 712-716 is formed as a one-piece structure protruding from the substrate 302 or STI 600. In some other embodiments, the dummy fins 712-716 may be formed concurrently with or subsequently to the formation of a dummy gate structure, which will be discussed as follows. When forming the dummy fins 712-716 in this way, each of the dummy fins 712-716 can include a number of dielectric structures relatively arranged to each other. These dummy fins that include a number of pieces of dielectric structures will be discussed in further detail below.

Figure 8A:
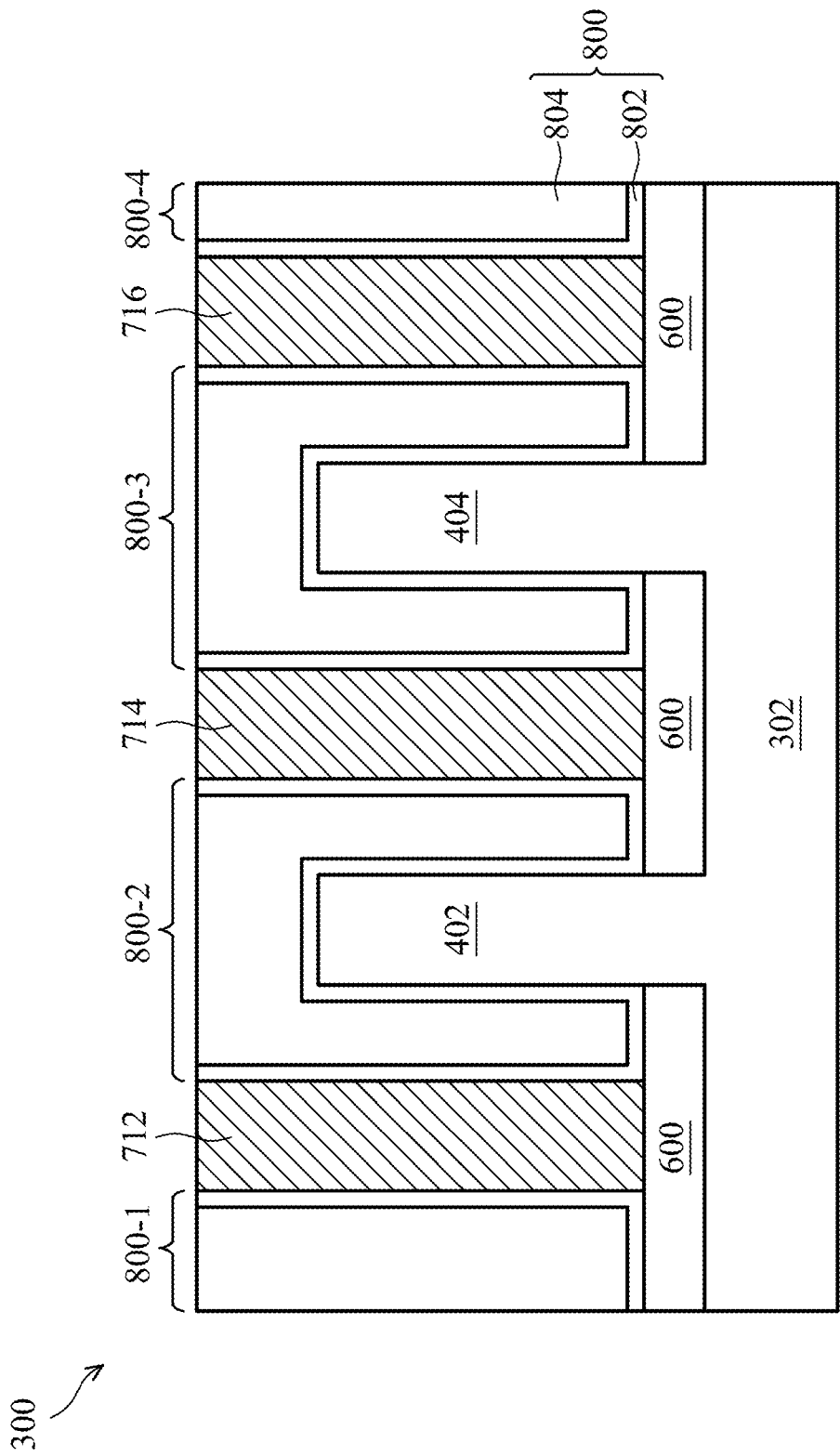
Figure 8B:
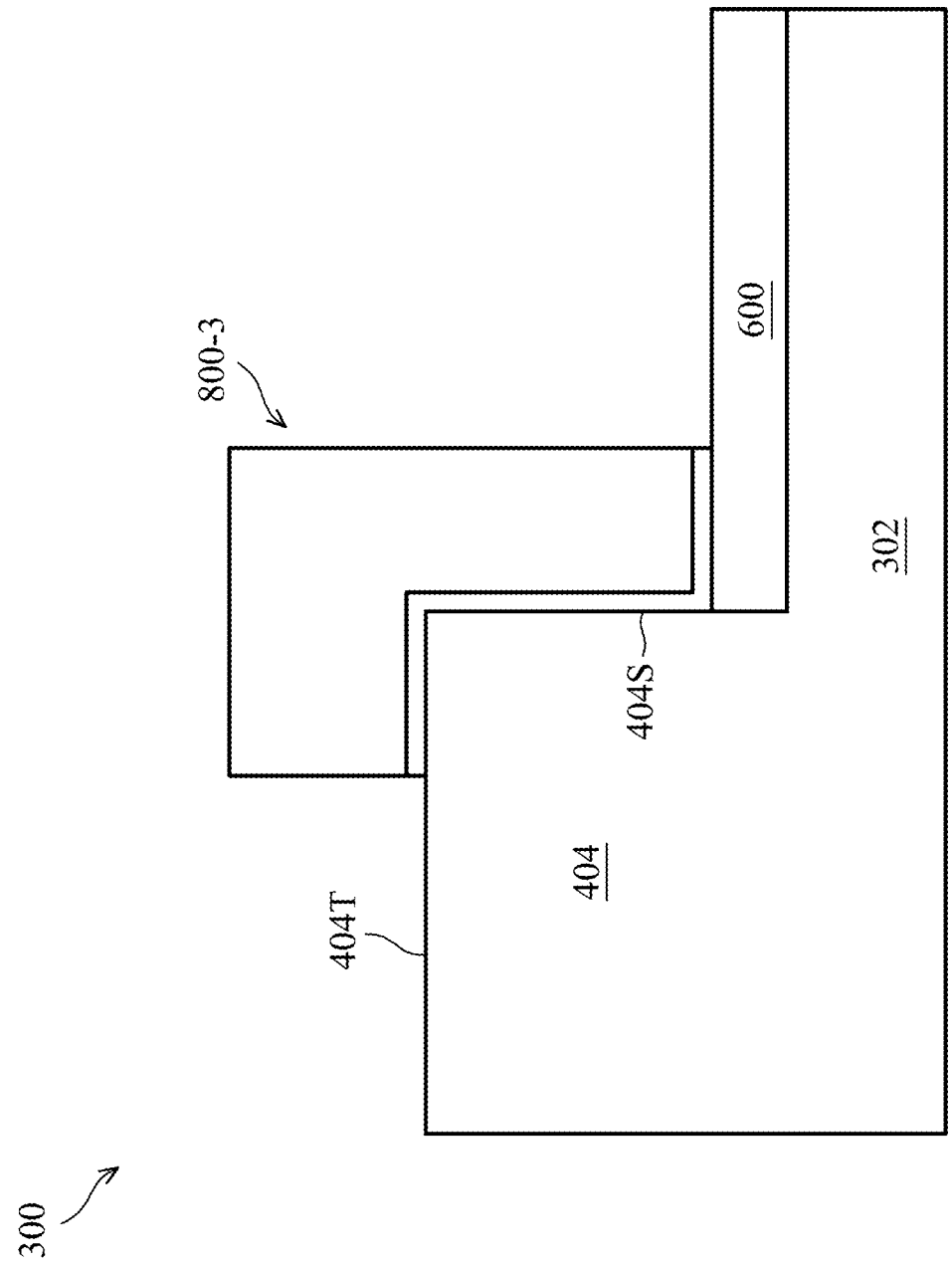
Figure 9A:
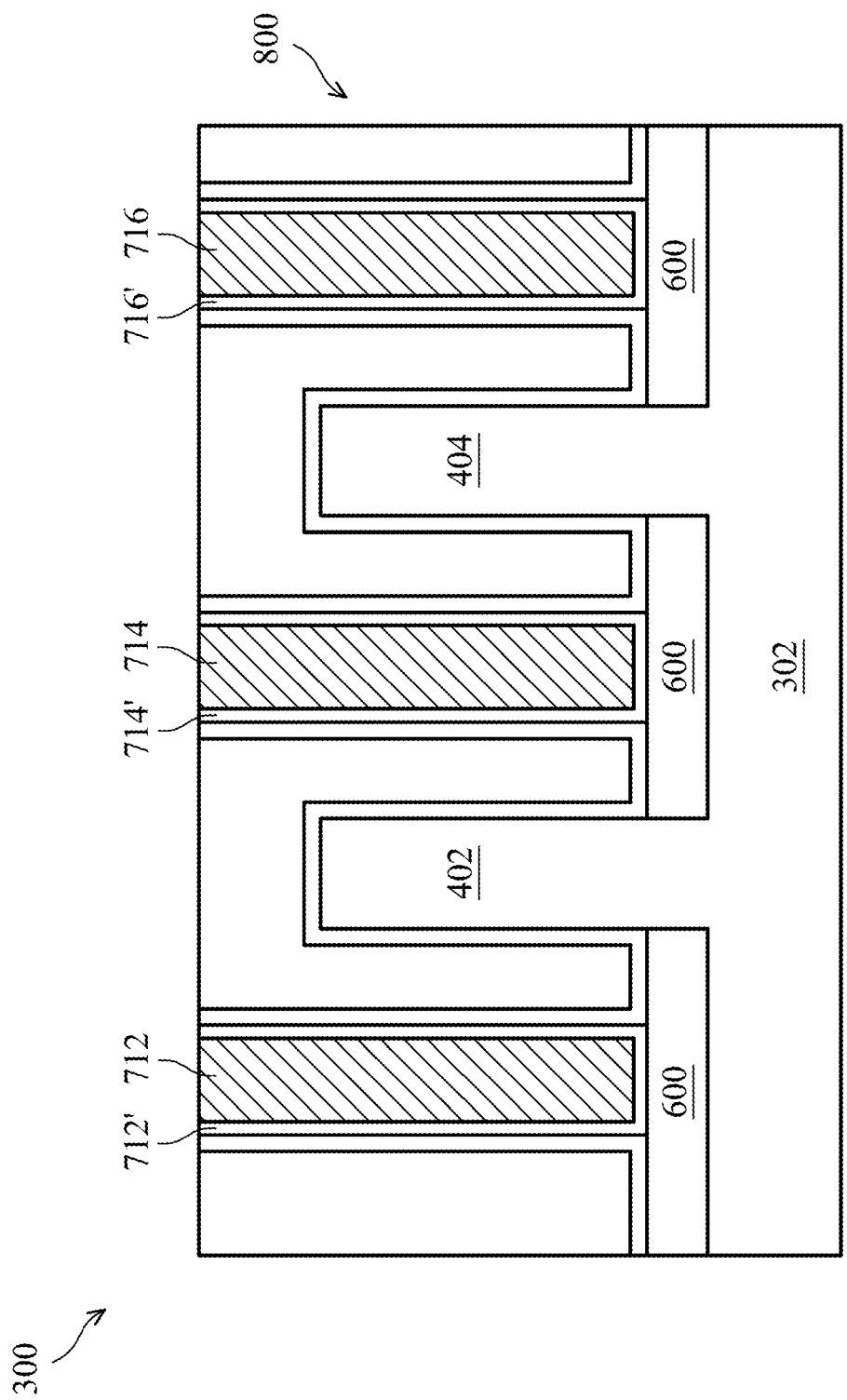
Figure 9B:
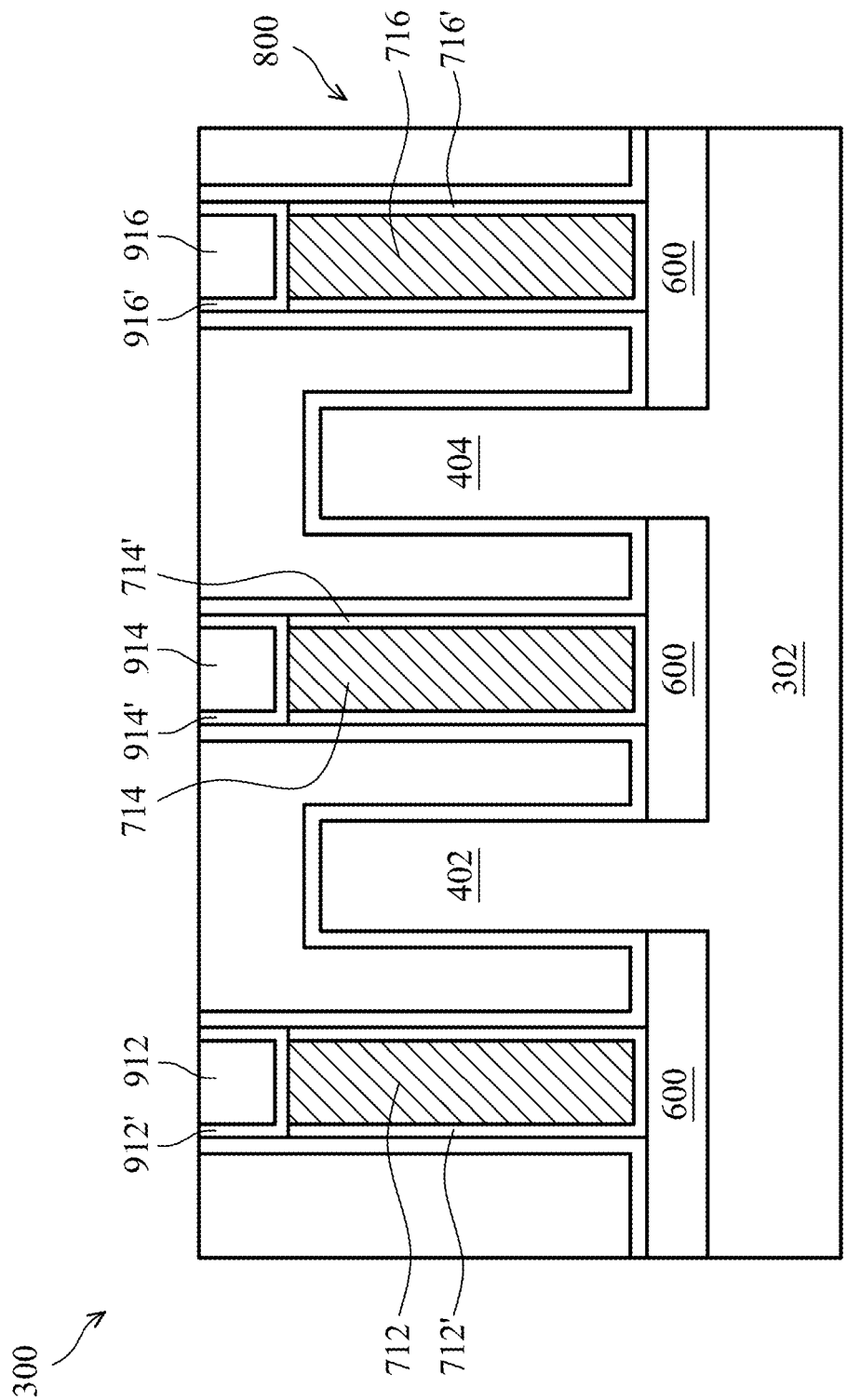
Figure 9C:
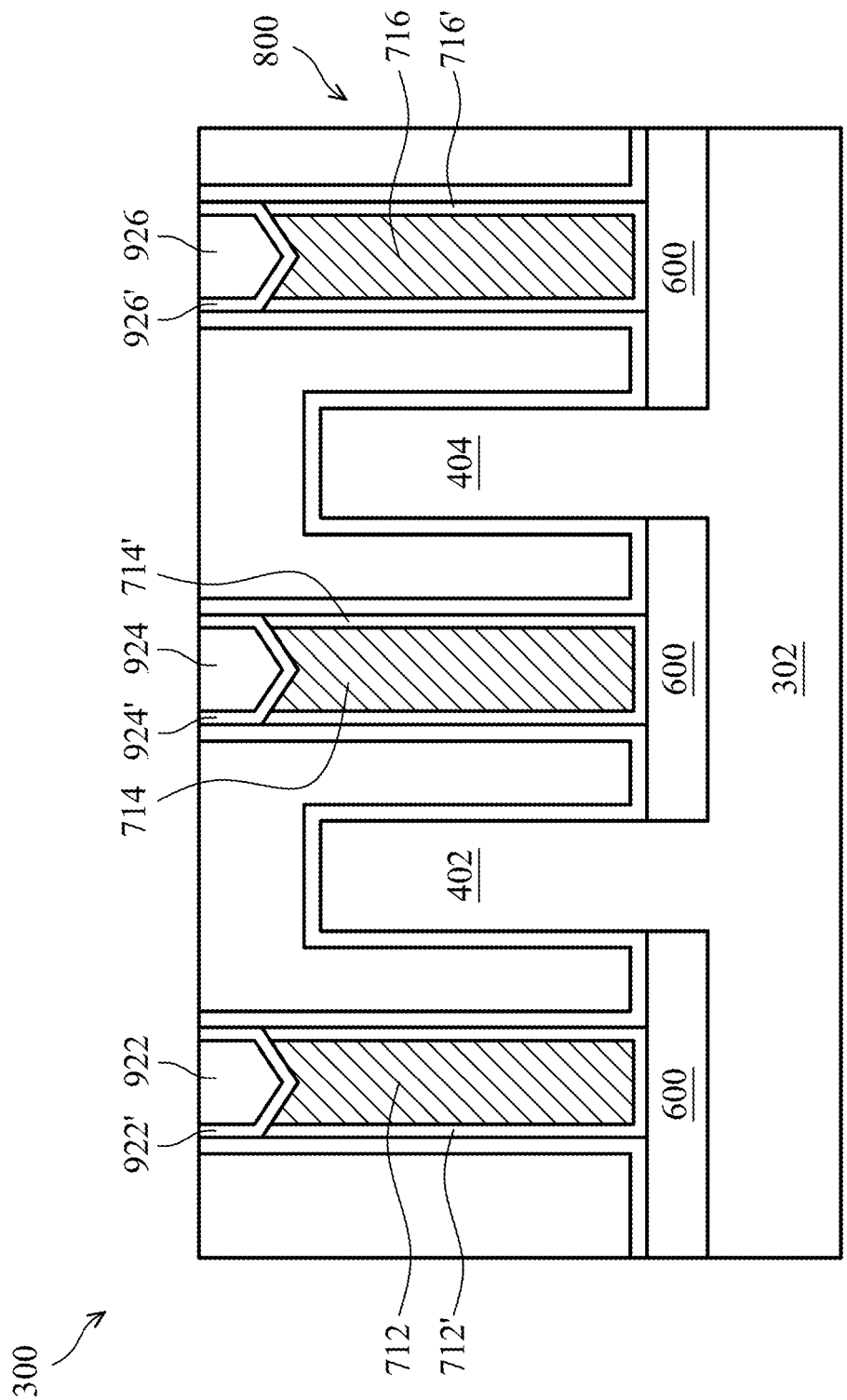

Corresponding to operation 212 of FIG. 2, FIG. 8A is a cross-sectional view of the FinFET device 300 including a dummy gate structure 800 at one of the various stages of fabrication. The cross-sectional view of FIG. 8A is cut along the lengthwise direction of the dummy gate structure 800 (e.g., cross-section B-B indicated in FIGS. 1A-B). Corresponding to the same operation, FIG. 8B illustrates another cross-sectional view of the FinFET device 300 cut along a lengthwise direction of the cut active fin 404 (e.g., cross-section C-C indicated in FIG. 1A). In some embodiments, the dummy gate structure 800 may correspond to a footprint where the gate structure 120 (as shown in FIGS. 1A-B) is formed.

In various embodiments, the dummy gate structure 800 may be formed with a similar height as the dummy fins 712-716. Consequently, the dummy gate structure 800 is cut into a number of different portions (along its lengthwise direction). These different portions may be respectively separated by the dummy fin structures 712-716. For example in FIG. 8A, the dummy gate structure 800 is cut into (dummy gate) portions 800-1, 800-2, 800-3, and 800-4. The portions 800-1 and 800-2 are separated by the dummy fin structure 712; the portions 800-2 and 800-3 are separated by the dummy fin structure 714; and the portions 800-3 and 800-4 are separated by the dummy fin structure 716. As the dummy fin structures are formed with the same height as the dummy gate structure 800, the dummy gate structure 800 is spontaneously cut into a number of portions by the dummy fin structures. Accordingly, an active gate structure that replaces the dummy gate structure may be cut into a number of separated (active gate) portions. However, in certain cases where some of the separated (active gate) portions are designed to be coupled to each other, the dummy fin structure(s) separating those portions may be recessed to allow those portions to electrically couple to each other, which will be discussed in further detail below.

The dummy gate structure 800 includes a dummy gate dielectric 802 and a dummy gate 804, in some embodiments. A mask (not shown) may be formed over the dummy gate structure 800. To form the dummy gate structure 800, a dielectric layer is formed to overlay the active fins 402-404 and extend along sidewalls of the dummy fins 712-716. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask. The pattern of the mask then may be transferred to the gate layer and the dielectric layer by a suitable etching technique to form the dummy gate 804 and the underlying dummy gate dielectric 802. The dummy gate 804 and the dummy gate dielectric 802 can straddle or otherwise cover a respective portion (e.g., a channel region) of each of the active fins 402-404. For example, when one dummy gate structure is formed, a dummy gate and dummy gate dielectric of the dummy gate structure may straddle respective central portions of the active fins. The dummy gate 804 may also have a lengthwise direction perpendicular to the lengthwise direction of the fins, including the active fins and dummy fins.

The dummy gate dielectric 802 is shown to be formed over the active fins 402-404 (e.g., over the respective top surfaces and the sidewalls of the active fins) and over the STIs 600 in the example of FIG. 8A. In some embodiments, the dummy gate dielectric 802 may be formed by, e.g., thermal oxidization of a material of the fins. As such, the dummy gate dielectric 802 may be formed over the active fins but not over the STIs 600. It should be appreciated that these and other variations are still included within the scope of the present disclosure.

Referring now to the cross-sectional view of FIG. 8B (cut along the lengthwise direction of the active fin 404), the cut active fin 404 is overlaid by the portion 800-3. Specifically, in addition to overlaying a portion of a top surface 404T of the active fin 404, the portion 800-3 can extend along one of the sidewalls (or edge) of the active fin 404 and be in contact with the top surface of a portion of the STI 600. Such a portion of the STI 600 may be formed over a portion of the substrate 302 that is exposed when cutting the active fin 404. As shown in the illustrated example of FIG. 8B, the portion 800-3 may present a reverse L-shape on this cross-section.

In some other embodiments, the dummy fins 712-716 may be formed, following the formation of the dummy gate structure 800. For example, after forming the dummy gate structure 800 that overlays the active fins 402-404 and be in contact with the top surface of the STI 600, portions of the dummy gate structure 800, which respectively define footprints of the to-be formed dummy fins, can be removed (e.g., etched). As such, a number of cavities extending through the dummy gate structure 800 are formed, thereby exposing portions of the top surface of the STI 600. Next, the cavities can be filled with one or more layers, each of which includes the above-described dielectric material of the dummy fins, to form the dummy fins 712-716. When multiple layers are formed, each of the dummy fins 712-716 can include one or more layers lining itself. For example in FIG. 9A, the dummy fins 712-716 are lined by the layers 712', 714' and 716', respectively.

Further, after filling the cavities with the one or more dielectric layers (to form the dummy fins 712-716), respective upper portions of the dummy fins 712-716 may be removed and then replaced with one or more other dielectric layers. For example in FIG. 9B, when removing the upper portions via an anisotropic etching process, the exposed top surfaces of the dummy fins 712-716 may have a flat surface. The one or more dielectric layers 912/912', 914/914', and 916/916' can thus follow such a flat profile. For example in FIG. 9C, when removing the upper portions via an isotropic etching process, the exposed top surfaces of the dummy fins 712-716 may have a valley-based surface. The one or more dielectric layers 922/922', 924/924', and 926/926' can thus follow such a valley-based profile.

Figure 10:
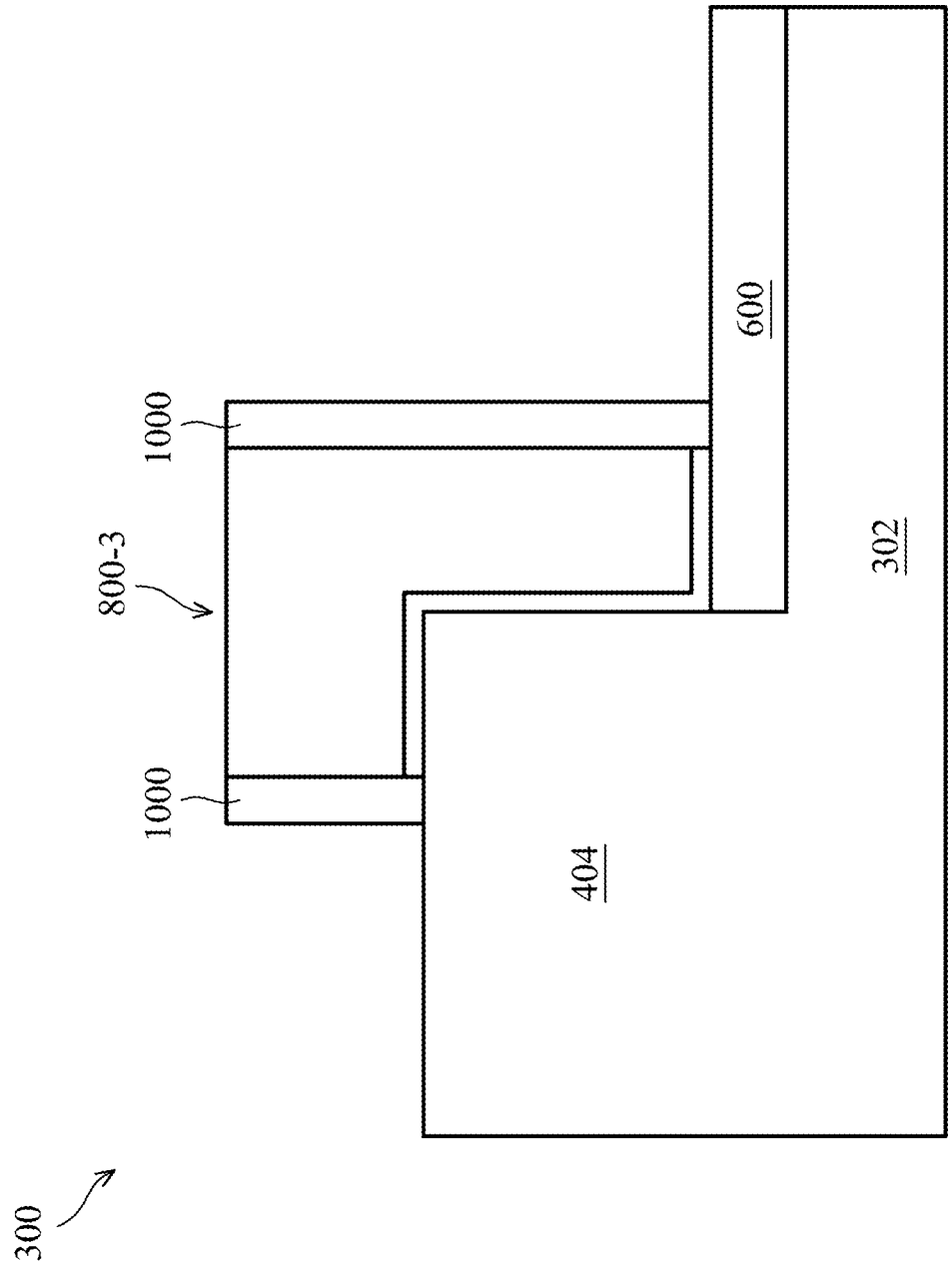

Corresponding to operation 214 of FIG. 2, FIG. 10 is a cross-sectional view of the FinFET device 300 including a gate spacer 1000 at one of the various stages of fabrication. The cross-sectional view of FIG. 10 is cut along a lengthwise direction of the cut active fin 404 (e.g., cross-section C-C indicated in FIG. 1A).

The gate spacer 1000 is formed around the dummy gate structure 800. For example, the gate spacer 1000 may be formed on opposing sidewalls of each portion of the dummy gate structure 800 (in FIG. 9, e.g., the gate spacer 1000 extending along opposite sidewalls of the dummy gate portion 800-3). Although the gate spacer 1000 is shown as a single layer in the example of FIG. 9 (and the following figures), it should be understood that the gate spacer can be formed to have any number of layers while remaining within the scope of the present disclosure. The gate spacer 1000 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 1000. The shapes and formation methods of the gate spacer 1000 as illustrated in FIG. 10 are merely non-limiting examples, and other shapes and formation methods are possible. These and other variations are fully intended to be included within the scope of the present disclosure.

Figure 11:
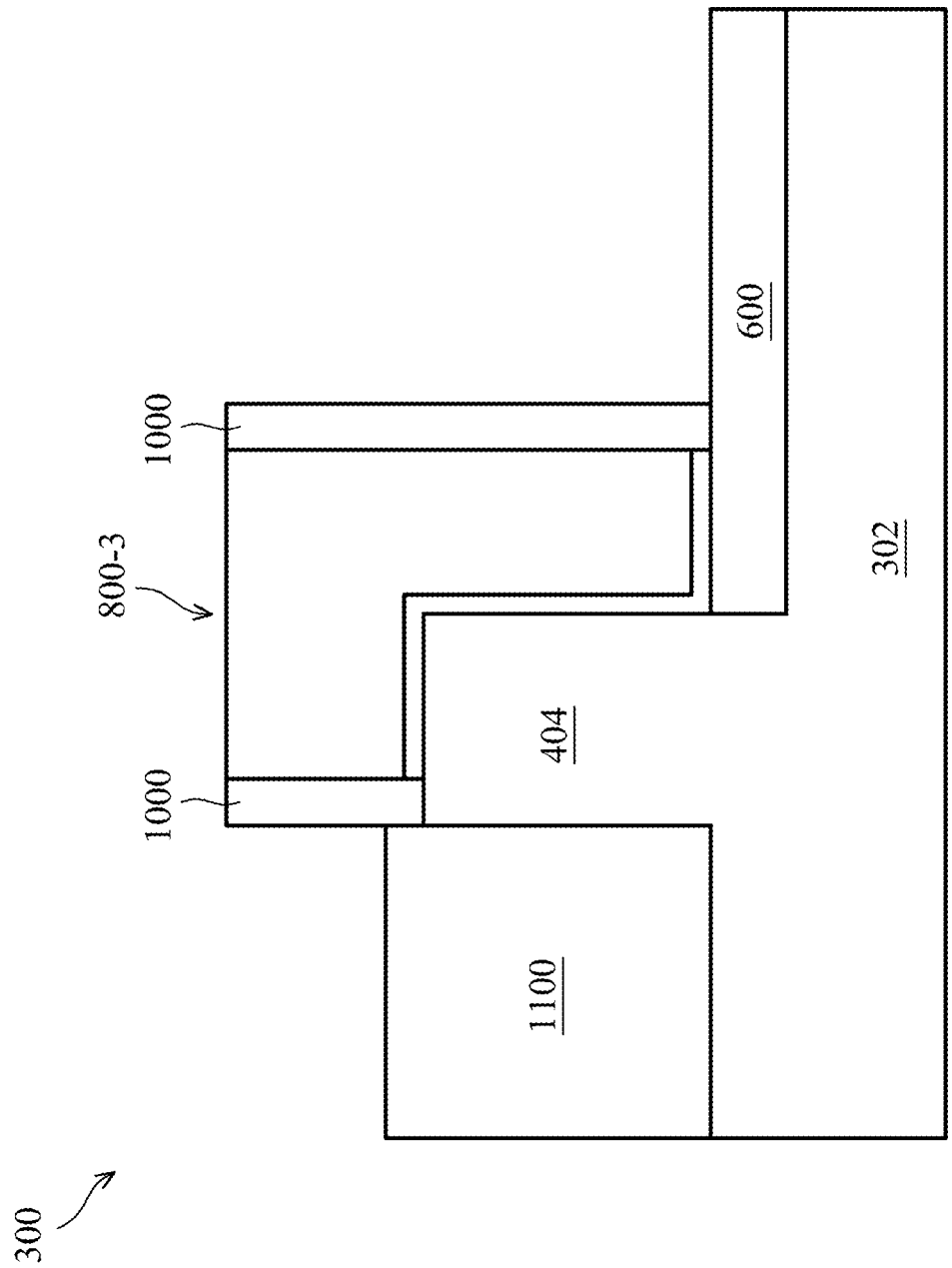
Figure 12:
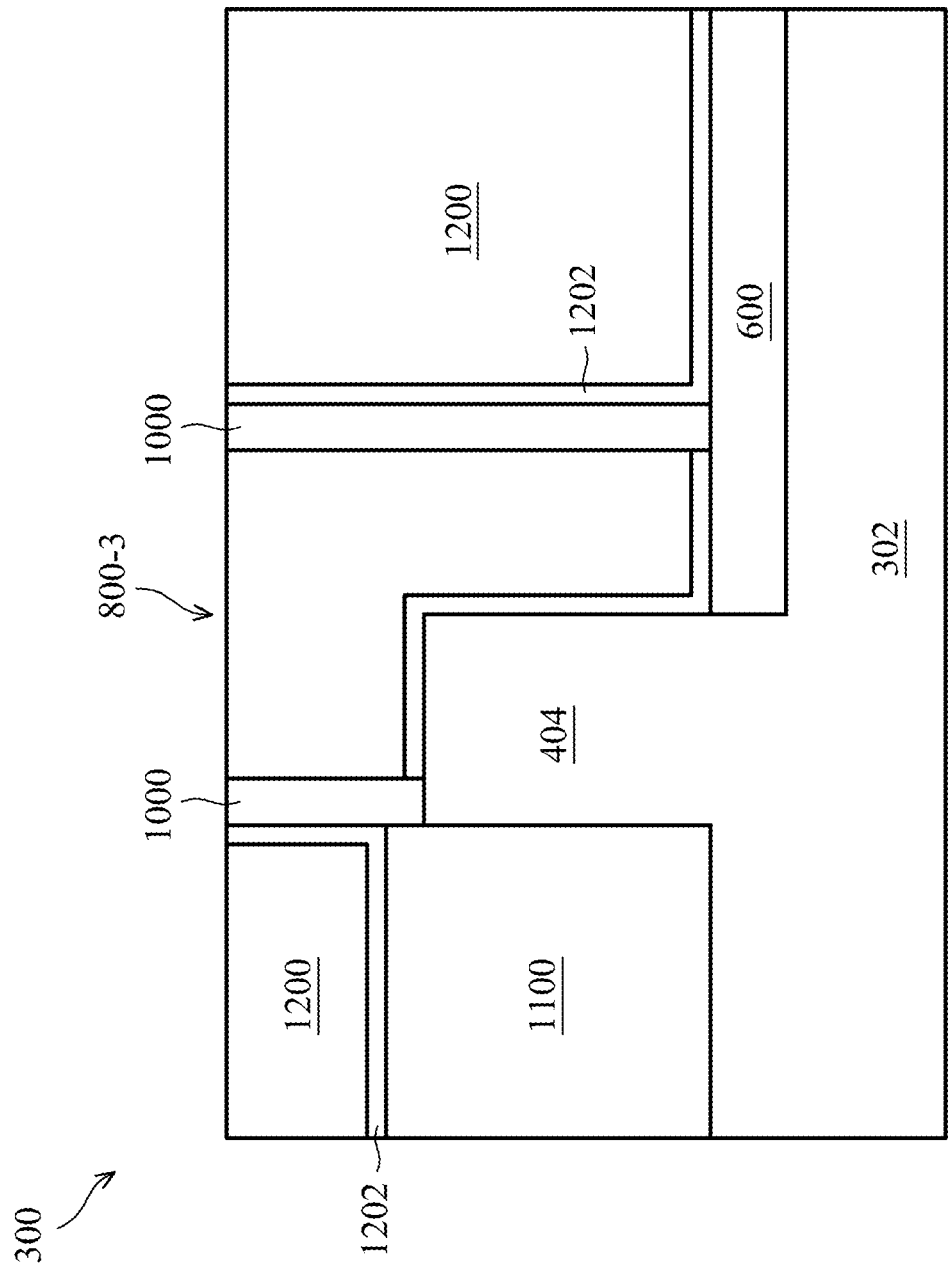

Corresponding to operation 216 of FIG. 2, FIG. 11 is a cross-sectional view of the FinFET device 300 including a number of source/drain structures 1100 at one of the various stages of fabrication. The cross-sectional view of FIG. 12 is cut along a lengthwise direction of the cut active fin 404 (e.g., cross-section C-C indicated in FIG. 1A). In some embodiments, the source/drain structure 1100 may correspond to the source/drain structure 138 shown in FIG. 1A.

The source/drain structure(s) are generally formed in recesses of each of the active fin adjacent to a dummy gate structure, e.g., between adjacent dummy gate structures and/or next to a dummy gate structure. The recesses are formed by, e.g., an anisotropic etching process using the dummy gate structure(s) with the corresponding gate spacer(s) as an etching mask, in some embodiments, although any other suitable etching process may also be used. As shown in FIG. 11, one source/drain structure 1100 is formed in a recess of the cut active fin 404. Specifically, the source/drain structure 1100 is formed on a side opposite to the edge of the active fin 404 that is exposed after being cut (see, e.g., FIG. 5). Although not shown, it should be understood that during this fabrication stage, the FinFET device 300 can include a number of pairs of source/drain structures formed in one or more other non-cut active fins (e.g., 402) on opposite sides of the dummy gate structure 800. For example, on the opposite sides of the dummy gate portion 800-2 (FIG. 8A), a pair of source/drain structures can be formed, which may correspond to the source/drain structures 134 and 136 shown in FIG. 1A, respectively.

The source/drain structures (e.g., 1100 of FIG. 11) are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 11, the epitaxial source/drain structure 1100 may have a surface raised from the top surface of the active fin 404 (e.g. raised above the non-recessed portions of the active fin 404). Further, the source/drain structure 1100 may have facets. In some embodiments, when the resulting FinFET device is an n-type FinFET, the source/drain structure 1100 can include silicon carbide (SiC), silicon phosphorous (SiP), phosphorous-doped silicon carbon (SiCP), or the like. In some embodiments, when the resulting FinFET device is a p-type FinFET, the source/drain structure 1100 can include SiGe, and a p-type impurity such as boron or indium.

The epitaxial source/drain structure 1100 may be implanted with dopants, followed by an annealing process. The implanting process may include forming and patterning masks such as a photoresist to cover the regions of the FinFET device 300 that are to be protected from the implanting process. The source/drain structure 1100 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain structure 1100 of a P-type transistor. N-type impurities, such as phosphorous or arsenide, may be implanted in the source/drain structure 1100 of an N-type transistor. In some embodiments, the epitaxial source/drain structure 1100 may be in situ doped during their growth.

Corresponding to operation 216 of FIG. 2, FIG. 12 is a cross-sectional view of the FinFET device 300 including an interlayer dielectric (ILD) 1200 at one of the various stages of fabrication. The cross-sectional view of FIG. 12 is cut along a lengthwise direction of the cut active fin 404 (e.g., cross-section C-C indicated in FIG. 1A). In some embodiments, the ILD 1200 may correspond to the ILD 152 shown in FIG. 1B.

In some embodiments, prior to forming the ILD 1200, a contact etch stop layer (CESL) 1202 is formed over the structure, as illustrated in FIG. 12. The CESL 1202 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1200 is formed over the CESL 1202 and over the dummy gate structure 800. In some embodiments, the ILD 1200 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1200 is formed, an optional dielectric layer (not shown) is formed over the ILD 1200. The dielectric layer can function as a protection layer to prevent or reduce the loss of the ILD 1200 in subsequent etching processes. The dielectric layer may be formed of a suitable material, such as silicon nitride, silicon carbonitride, or the like, using a suitable method such as CVD, PECVD, or FCVD. After the dielectric layer is formed, a planarization process, such as a CMP process, may be performed to achieve a level upper surface for the dielectric layer. The CMP may also remove the mask (used to define the dummy gate structure 800) and portions of the CESL 1202 disposed over the dummy gate structure. After the planarization process, the upper surface of the ILD 1200 or the dielectric layer (if formed) is level with the upper surface of the dummy gate, in some embodiments.

An example gate-last process (sometimes referred to as replacement gate process) can then performed to replace the dummy gate structure 800 with an active gate structure (which may also be referred to as a replacement gate structure or a metal gate structure). Prior to forming the active gate structure, one or more of the dummy fins may be recessed so as to allow some portions of the active gate structure to electrically couple to each other. FIGS. 13-15B illustrate the cross-sectional views of further processing (or making) of the FinFET device 300, which will be discussed in more detail as follows.

Figure 13:
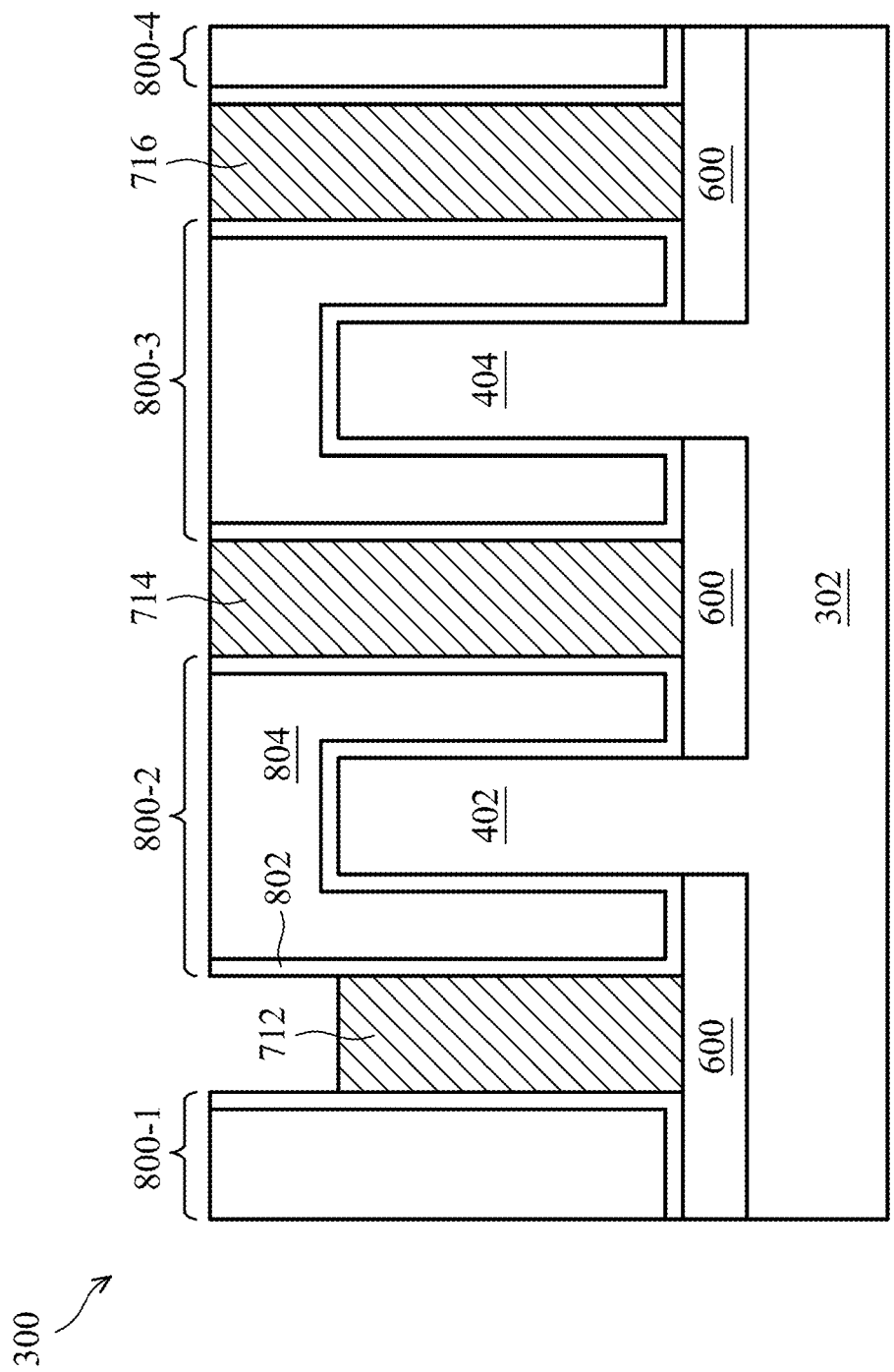

Corresponding to operation 218 of FIG. 2, FIG. 13 is a cross-sectional view of the FinFET device 300 in which the dummy fin 712 is recessed at one of the various stages of fabrication. The cross-sectional view of FIG. 13 is cut along the lengthwise direction of the dummy gate structure 800 (e.g., cross-section B-B indicated in FIGS. 1A-B).

The dummy fin 712 may be selected to be recessed as the respective portions of an active gate structure that will later replace the dummy gate portions 800-1 and 800-2 are designed to be electrically coupled to each other. By recessing the dummy fin 712, a cavity may be formed between the portions 800-1 and 800-2, which can be filled with a metal gate. Thus, the active gate portions that replace the dummy gate portions 800-1 and 800-2 can be electrically coupled to each other by the metal-filled cavity. To recess the dummy fin 712, a mask (not shown) may be formed over the workpiece to expose a portion of the dummy fin 712, followed by an etching processes to remove an upper portion of the dummy fin 712, as illustrated in FIG. 13.

The etching process may be configured to have at least some anisotropic etching characteristic to limit the undesired lateral etch. For example, the etching process can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof to control the above-described etching rates. As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the etching process. However, it is noted that source powers, bias powers, pressures, and flow rates outside of these ranges are also contemplated.

In another example, the etching process can include a wet etching process, which can have a certain amount of isotropic characteristic, in combination with the plasma etching process. In such a wet etching process, a main etch chemical such as hydrofluoric acid (HF), fluorine ($F_2$), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof to control the above-described etching rates.

In some embodiments, the dummy fin 712 may be recessed, while leaving the neighboring dummy gate portions 800-1 and 800-2 substantially intact. As such, the cavity may have a similar width as the dummy fin 712. However, it should be understood that portions of the dummy gate portions 800-1 and 800-2 can also be etched during recessing the dummy fin 712, while remaining within the scope of the present disclosure. As such, the cavity may be formed with a wider width than the dummy fin 712. Further, although the recessed top surface of the dummy fin 712 is shown as having a flat surface in FIG. 13, it should be understood that the recessed top surface of the dummy fin 712 can be convex, concave, or otherwise curvature-based.

Figure 14:
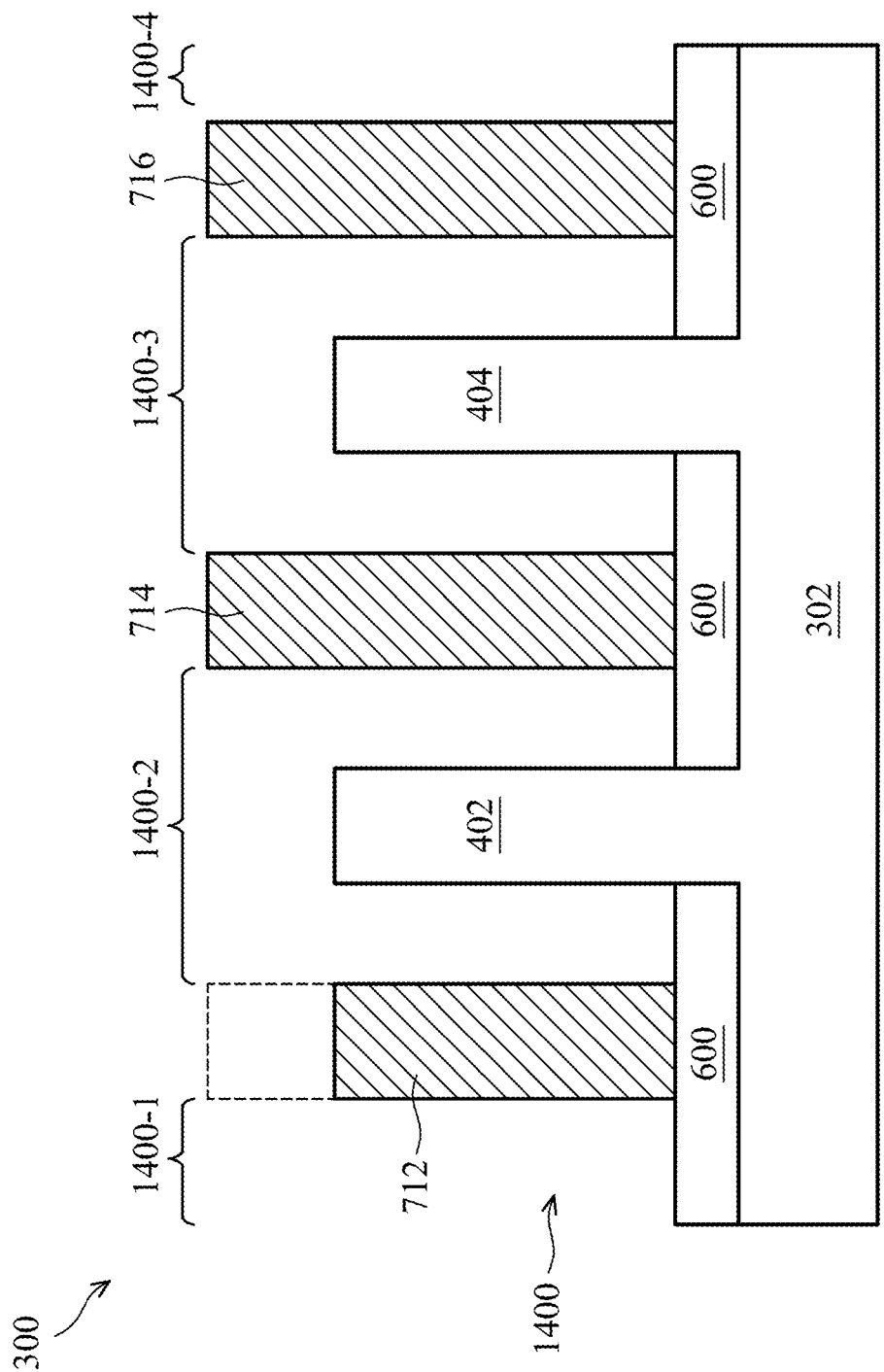

In some other embodiments, the dummy fin 712 may be recessed after the dummy gate structure 800 is removed. FIG. 14 illustrates a cross-sectional view of the FinFET device 300 at one of various fabrication stages in such embodiments. The cross-sectional view of FIG. 14 is cut along the same direction as FIG. 13. As shown in FIG. 14, after removing the dummy gate structure 800, a gate trench 1400 can be formed. The gate trench 1400 may also have a number of portions, 1400-1, 1400-2, 1400-3, and 1400-4, separated by the dummy fins 712-716. Upon forming the gate trench, the dummy fin 712 may be recessed through the similar processes as discussed above. Once the upper portion of the dummy fin 712 is removed, the separated (gate trench) portions 1400-1 and 1400-2 may become connected to each other, as shown in FIG. 14.

Figure 15A:
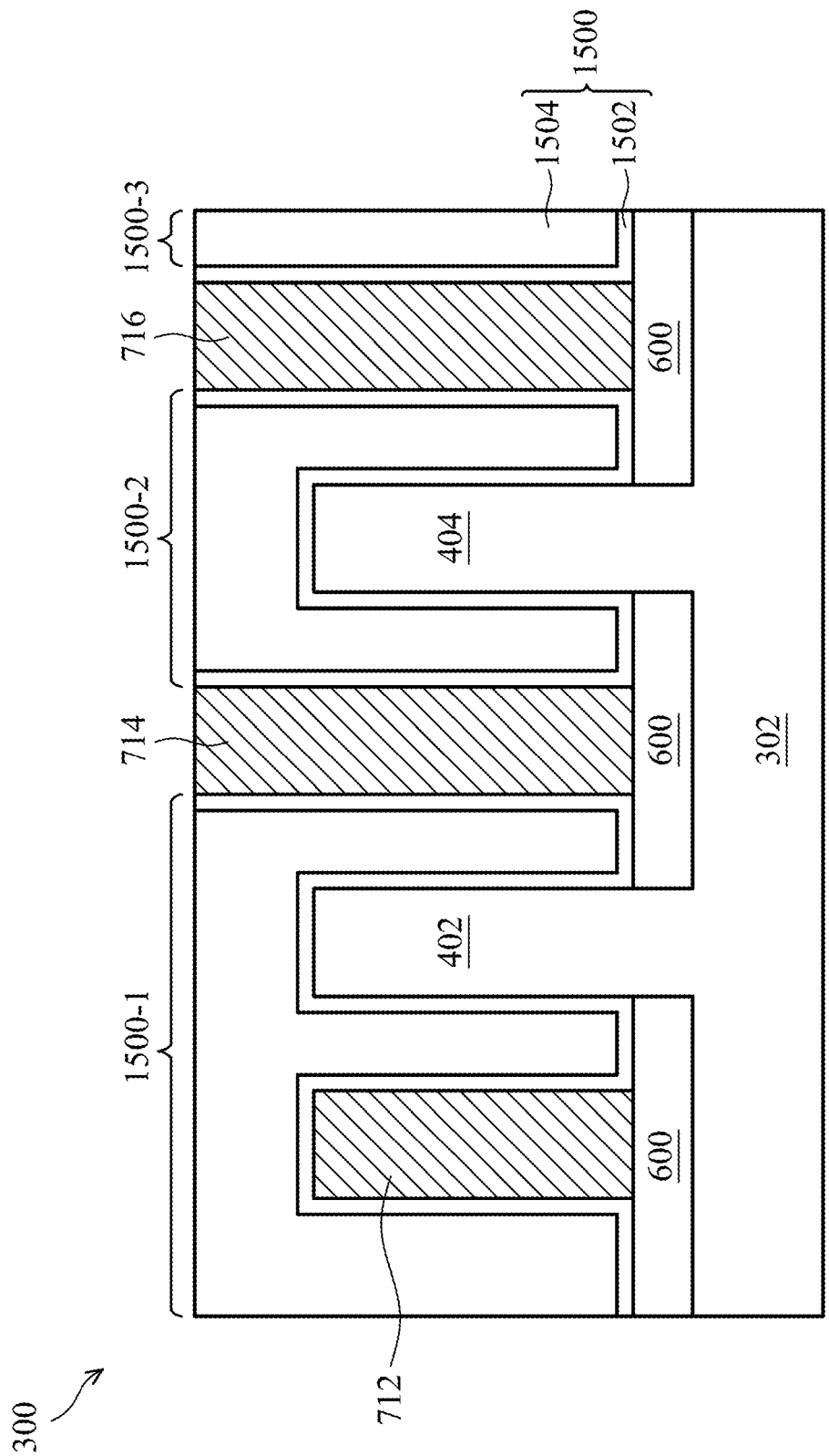
Figure 15B:
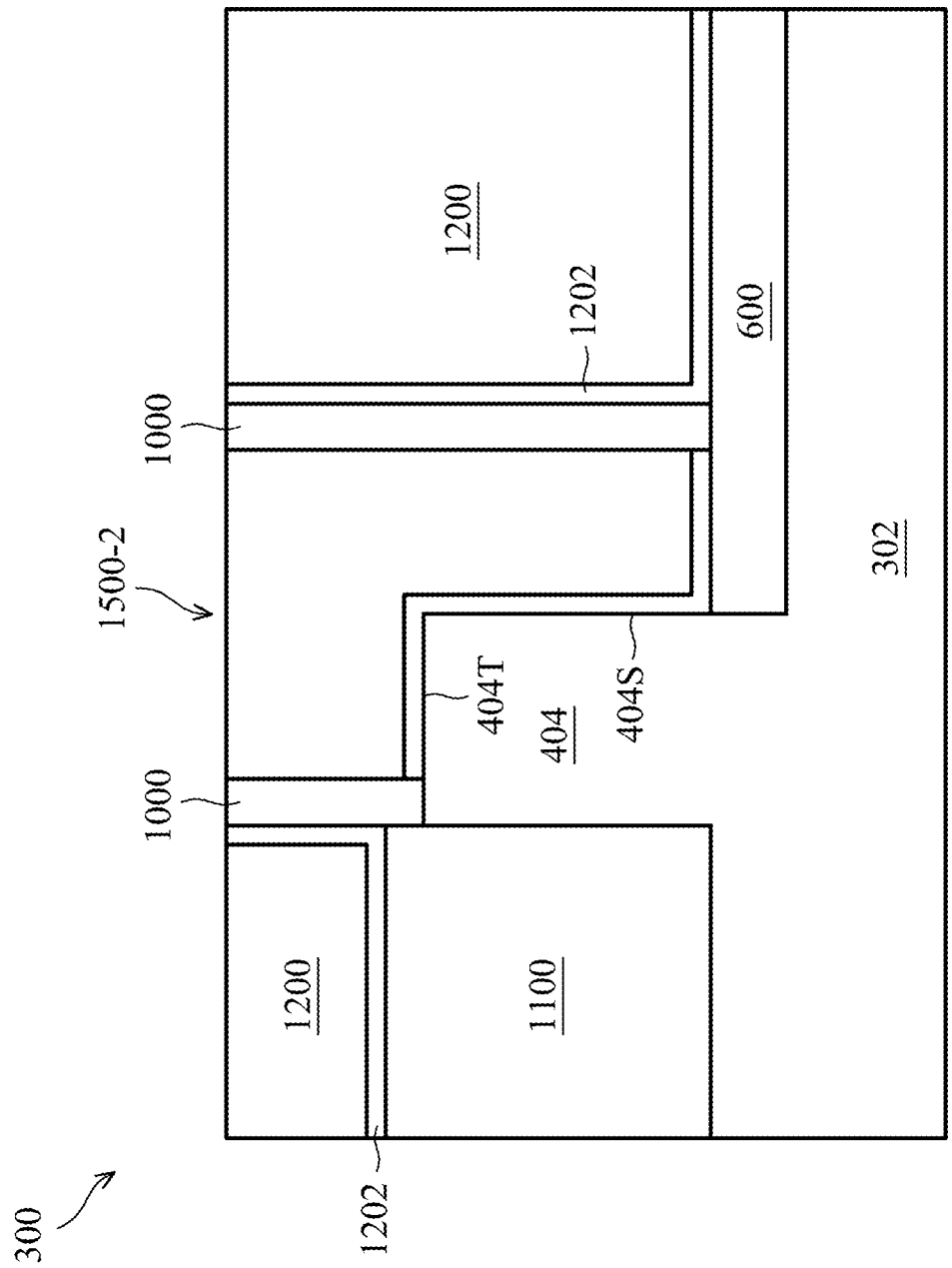

Corresponding to operation 220 of FIG. 2, FIG. 15A is a cross-sectional view of the FinFET device 300 including an active gate structure 1500 at one of the various stages of fabrication. The cross-sectional view of FIG. 15A is cut along a lengthwise direction of the active gate structure 1400 (e.g., cross-section B-B indicated in FIG. 1). Corresponding to the same operation, FIG. 15B illustrates another cross-sectional view of the FinFET device 300 cut along a lengthwise direction of the cut active fin 404 (e.g., cross-section C-C indicated in FIG. 1A). In some embodiments, the active gate structure 1500 may correspond to the gate structure 120 (as shown in FIGS. 1A-B).

The active gate structure 1500 may be formed by replacing the dummy gate structure 800. Specifically, the active gate structure 1500 can be formed by filling a gate trench (formed by removing the dummy gate structure 800) with at least a gate dielectric layer and a metal gate layer. As illustrated, the active gate structure 1500 may include (active gate) portions, 1500-1, 1500-2, and 1500-3, that are separated by the dummy fins 714 and 716. The portion 1500-1 can overlay the active fin 402, and the portion 1500-2 can overlay the cut active fin 404. After the active gate structure 1500 is formed, the FinFET device 300 can include a number of transistors. For example, an active transistor, adopting the portion 1500-1 as its active gate structure and a portion of the active fin 402 (overlaid by the portion 1500-1) as its channel, may be formed. However, it should be appreciated that the portion 1200-2 and the cut active fin 404B (that is overlaid by the portion 1500-2) may not form an active transistor. As defined above, the active gate portions 1500-1 and 1500-2 are sometimes referred to as non-PODE and PODE, respectively.

The active gate structure 1500 can include a gate dielectric layer 1502, a metal gate layer 1504, and one or more other layers that are not shown for clarity. For example, the active gate structure 1500 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layer 1502 is formed in a corresponding gate trench to surround (e.g., straddle) one or more fins. In an embodiment, the gate dielectric layer 1502 can be a remaining portion of the dummy gate dielectric 802. In another embodiment, the gate dielectric layer 1502 can be formed by removing the dummy gate dielectric 802, followed by conformal deposition or thermal reaction. In yet another embodiment, the gate dielectric layer 1502 can be formed by removing the dummy gate dielectric 802, followed by no further processing step (i.e., the gate dielectric layer 1502 may be a native oxide over the active fins 402-404).

The gate dielectric layer 1502 includes silicon oxide, silicon nitride, or multilayers thereof. In example embodiments, the gate dielectric layer 1502 includes a high-k dielectric material, and in these embodiments, the gate dielectric layer 1502 may have a k value greater than about 7.0, and may include a metal oxide or a silicate of Hf, Al, Zr, La, Mg, Ba, Ti, Pb, or combinations thereof. The formation methods of gate dielectric layer 1502 may include molecular beam deposition (MBD), atomic layer deposition (ALD), PECVD, and the like. A thickness of the gate dielectric layer 1502 may be between about 8 Å and about 20 Å, as an example.

The metal gate layer 1504 is formed over the gate dielectric layer 1502. The metal gate layer 1504 may be a P-type work function layer, an N-type work function layer, multi-layers thereof, or combinations thereof, in some embodiments. Accordingly, the metal gate layer 1504 is sometimes referred to as a work function layer. For example, the metal gate layer 1504 may be an N-type work function layer. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

Referring now to the cross-sectional view of FIG. 15B (cut along the lengthwise direction of the active fin 404), the cut active fin 404 is overlaid by the (active gate) portion 1500-2, which replaces the (dummy gate) portion 800-3 (FIG. 8B). Thus, the active gate portion 1500-2 can inherit the profiles and dimensions of the dummy gate portion 800-3. For example, in addition to overlaying a portion of a top surface 404T of the active fin 404, the portion 1500-2 can extend along one of the sidewalls (or edge) of the active fin 404 and be in contact with the top surface of a portion of the STI 600. As shown in the illustrated example of FIG. 15B, the portion 1500-2 may present a reverse L-shape on this cross-section.

Figure 16:
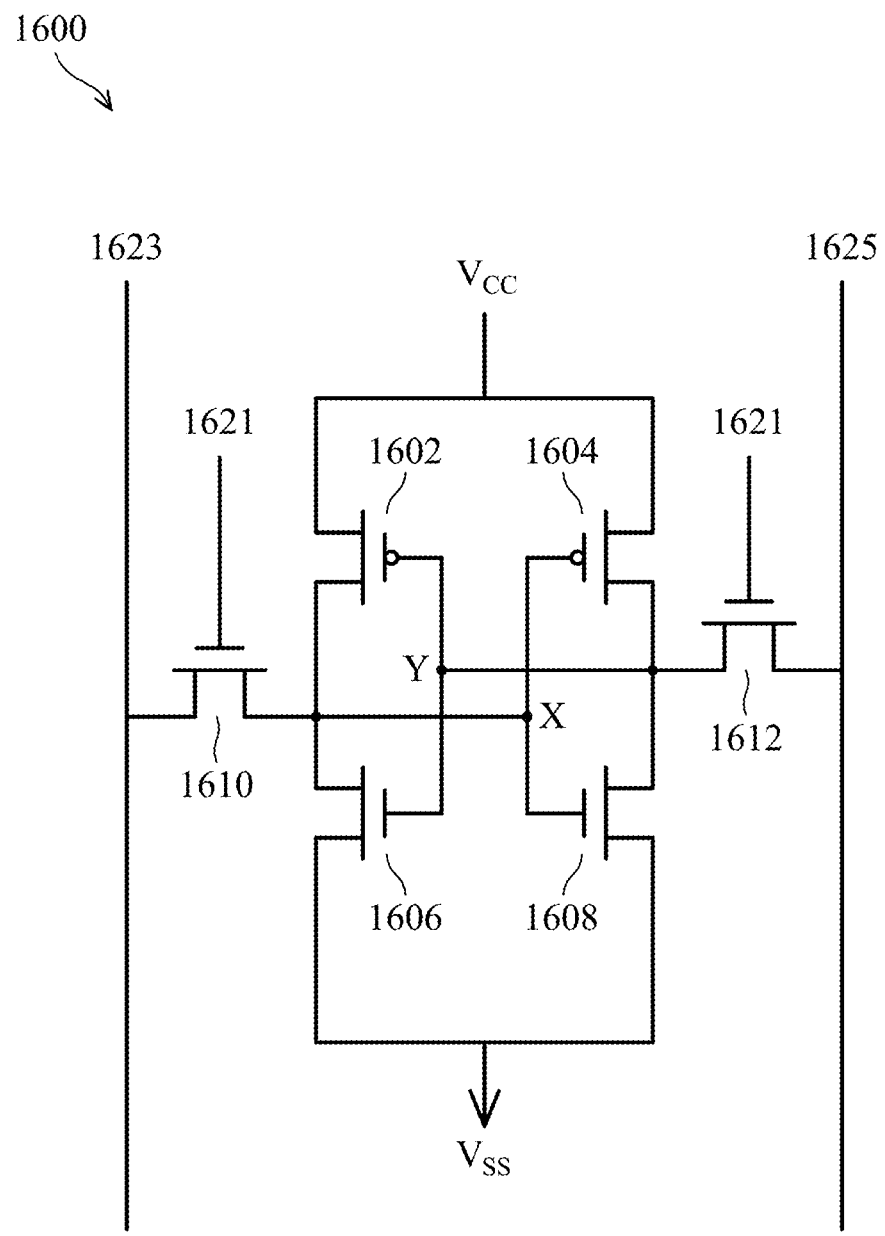
FIG. 16 illustrates a circuit diagram of an example circuit that can be formed by the method of FIG. 2, in accordance with some embodiments.
Figure 17:
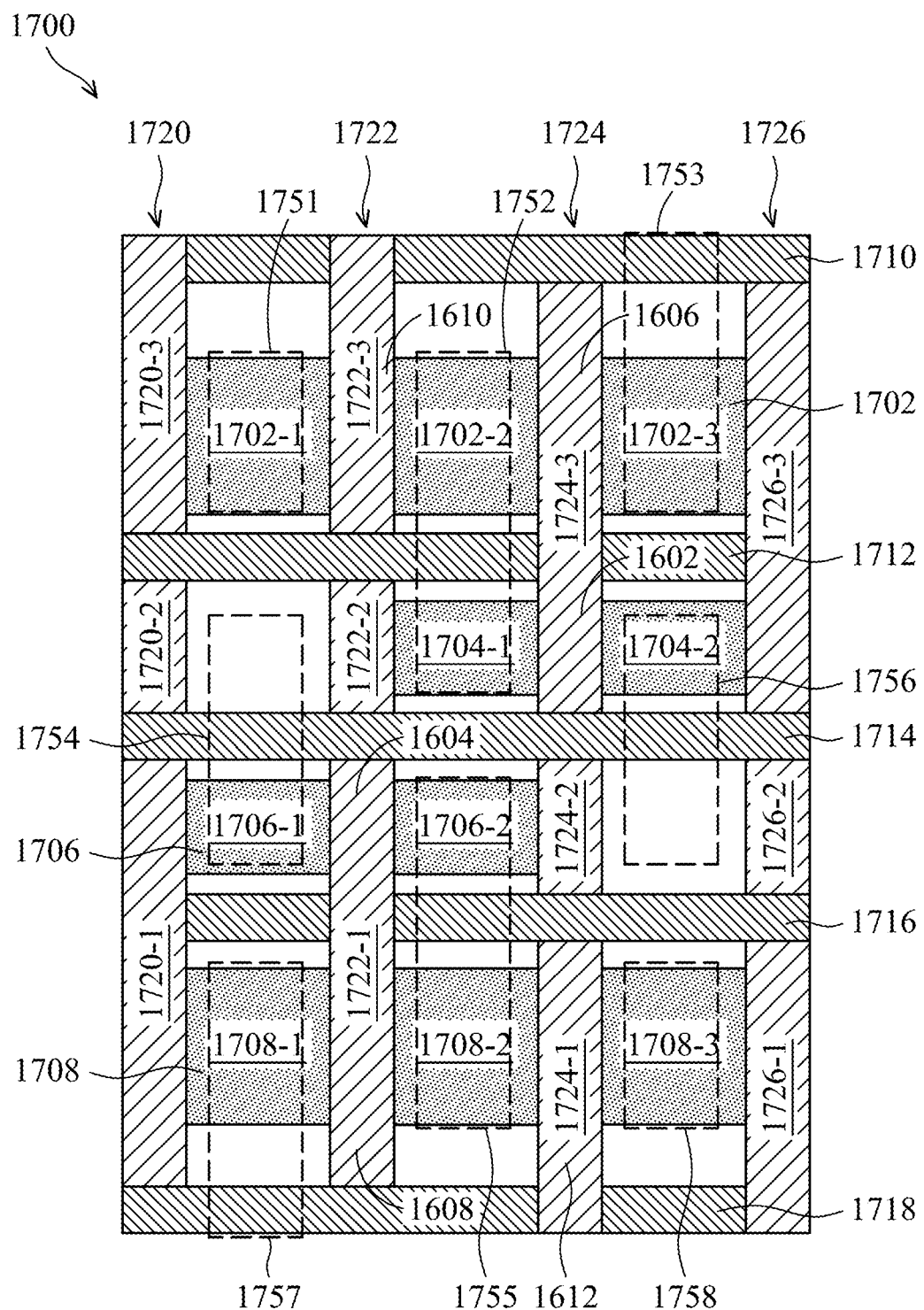
FIG. 17 illustrates a top view of a portion of an integrated circuit that includes the example circuit of FIG. 16, made by the method of FIG. 2, in accordance with some embodiments.

FIG. 16 illustrates a circuit diagram of an example circuit 1600 that can be formed by the disclosed methods, and FIG. 17 illustrates a top view of a portion of an integrated circuit 1700 including a number of the example circuits 1600 that are formed in accordance with the disclosed methods. As shown in FIG. 16, the circuit 1600 includes a six-transistor (6T) Static Random Access Memory (SRAM) cell. However, it should be understood that any of various other circuits can also be formed by the disclosed methods such as, for example, an eight-transistor (8T) SRAM cell, a ten-transistor (10T) SRAM cell, a dual port SRAM cell, etc., while remaining within the scope of the present disclosure.

Referring first to FIG. 16, the circuit 1600 includes six transistors: 1602, 1604, 1606, 1608, 1610, and 1612. The transistors 1602-1604 are each implemented as a p-type transistor, and the transistors 1606-1612 are each implemented as an n-type transistor. The transistors 1602-1608 are coupled between a first power supply, VCC (e.g., 0.75V), and a second power supply, VSS (e.g., ground). Further, the pair of transistors 1602 and 1606 and the pair of transistors 1604 and 1608 function as a first invertor and a second invertor, respectively. These two inverters are cross-coupled to each other, with a first internal node "X" coupled to a bit line (BL) 1623 through the transistor 1610 and a second internal node "Y" coupled to a bit line bar (BLB) 1625 through the transistor 1612. The transistors 1610 and 1612 are gated by a word line (WL) 1621. In general, the transistors 1602-1604 are referred to as pull-up (PU) transistors; the transistors 1606-1608 are referred to as pull-down (PD) transistors; and transistors 1610-1612 are referred to as pass-gate (PG) transistors.

Referring then to FIG. 17, upon being at least partially formed, the integrated circuit 1700 includes active regions 1702, 1704, 1706, and 1708, each of which may be formed as a fin structure extending along a first lateral direction, as discussed above. Hereinafter, the active regions 1702-1708 are referred to as active fins 1702-1708, respectively. In some embodiments, the active fins 1702 and 1708 are formed in a first conduction type (e.g., n-type), and the active fins 1704 and 1706 are formed in a second conduction type (e.g., p-type). The integrated circuit 1700 includes dummy regions 1710, 1712, 1714, 1716, and 1718, each of which may also be formed as a fin structure extending along the same first lateral direction, as discussed above. Hereinafter, the dummy regions 1710-1718 are referred to as active fins 1710-1718, respectively. The integrated circuit 1700 includes active gate structures 1720, 1722, 1724, and 1726, each of which may extend along a second lateral direction, as discussed above.

Each active fin is straddled (or otherwise overlaid) by the active gate structures 1720-1726 to define the respective channels of a number of transistors, and on the opposite sides of each active gate structure in the active fin, a number of source/drain structures can be formed. For example, source/drain structures 1702-1 and 1702-2 are formed on opposite sides of the active gate structure 1722 in the active fin 1702; source/drain structures 1702-2 and 1702-3 are formed on opposite sides of the active gate structure 1724 in the active fin 1702; source/drain structures 1704-1 and 1704-2 are formed on opposite sides of the active gate structure 1724 in the active fin 1704; source/drain structures 1706-1 and 1706-2 are formed on opposite sides of the active gate structure 1722 in the active fin 1706; source/drain structures 1708-1 and 1708-2 are formed on opposite sides of the active gate structure 1722 in the active fin 1708; and source/drain structures 1708-2 and 1708-3 are formed on opposite sides of the active gate structure 1724 in the active fin 1708.

By using the disclosed methods to form the integrated circuit 1700, the active gate structures can each be cut into a number of portions by the dummy fins, upon those dummy fins being formed. For example, the active gate structure 1720 is cut into (active gate) portions 1720-1, 1720-2, and 1720-3 by the dummy fins 1714 and 1712, respectively; the active gate structure 1722 is cut into (active gate) portions 1722-1, 1722-2, and 1722-3 by the dummy fins 1714 and 1712, respectively; the active gate structure 1724 is cut into (active gate) portions 1724-1, 1724-2, and 1724-3 by the dummy fins 1716 and 1714, respectively; and the active gate structure 1726 is cut into (active gate) portions 1726-1, 1726-2, and 1726-3 by the dummy fins 1716 and 1714, respectively.

As such, those six transistors of a 6T-SRAM cell (e.g., 1600) can be realized. For example, the PG transistor 1610 can be defined by the active gate portion 1722-3 and the source/drain structures 1702-1 and 1702-2; the PD transistor 1606 can be defined by the active gate portion 1724-3 and the source/drain structures 1702-2 and 1702-3; the PU transistor 1602 can be defined by the active gate portion 1724-3 and the source/drain structures 1704-1 and 1704-2; the PU transistor 1604 can be defined by the active gate portion 1722-1 and the source/drain structures 1706-1 and 1706-2; the PD transistor 1608 can be defined by the active gate portion 1722-1 and the source/drain structures 1708-1 and 1708-2; and the PG transistor 1612 can be defined by the active gate portion 1724-1 and the source/drain structures 1708-2 and 1708-3. It should be understood that the integrated circuit 1700 can include any number of 6T-SRAM cells, while remaining within the scope of the present disclosure. Such 6T-SRAM cells may abut to each other, and thus, share some of the structures. The active fins 1702-1708 may each laterally extend further, which may be overlaid by a number of active gate structures to form neighboring cells. For example, the active gate structure 1720, with the source/drain structure 1702-1 and a source/drain structure formed opposite the portion 1720-3 from the source/drain structure 1702-1 (not shown), can form one of the PG transistors of a neighboring (e.g., abutted to the left) cell.

Further, the integrated circuit 1700 includes a number of contacts 1751, 1752, 1753, 1754, 1755, 1756, 1757, and 1758. Each of the source/drain structures can be electrically coupled to a corresponding one of the contacts, causing the six transistors to collectively function as an SRAM cell. For example, the contact 1751 electrically connects the source/drain structure 1702-1 to a BL (e.g., 1623); the contact 1752 electrically connects the source/drain structures 1702-2 and 1704-1 together (thereby forming the internal node X); the contact 1753 electrically connects the source/drain structure 1702-3 to VSS; the contact 1754 electrically connects the source/drain structure 1706-1 to VCC; the contact 1755 electrically connects the source/drain structures 1706-2 and 1708-2 together (thereby forming the internal node Y); the contact 1756 electrically connects the source/drain structure 1704-2 to VCC; the contact 1757 electrically connects the source/drain structure 1708-1 to VSS; and the contact 1758 electrically connects the source/drain structure 1708-3 to a BLB (e.g., 1625).

In the existing technologies, the gate structures between neighboring PU transistors of a 6T SRAM cell are continuous (i.e., not being cut). This is because cutting these gate structures typically requires cutting a large number of other gate structures between the PU transistors of neighboring SRAM cells. Using the existing technologies to cut such a large number of gate structures commonly results in a discrepancy of cut profiles, which can disadvantageously induce a short between a contact and an active gate structure (e.g., between the contact 1756 and the active gate structure 1726, between the contact 1754 and the active gate structure 1720). However, using the disclosed methods to make the integrated circuit 1700, the active gate structures 1720-1726 can each be spontaneously cut between the PU transistors (e.g., 1602 and 1604) by the dummy fin 1714 (upon the dummy fin 1714 being formed). Alternatively stated, the disclosed methods does not require an additional step to cut gate structures. In this way, the contact-gate short issues can be avoided.

In one aspect of the present disclosure, a semiconductor device is disclosed. The semiconductor device includes a first semiconductor fin extending along a first direction. The semiconductor device includes a second semiconductor fin also extending along the first direction. The semiconductor device includes a dielectric fin disposed between the first and second semiconductor fins, wherein the dielectric fin also extends along the first direction. The semiconductor device includes a gate structure extending along a second direction perpendicular to the first direction, the gate structure comprising a first portion and a second portion. A top surface of the dielectric fin is vertically above respective top surfaces of the first and second semiconductor fins. The first portion and the second portion are electrically isolated by the dielectric fin. The first portion of the gate structure overlays an edge portion of the first semiconductor fin, and the second portion of the gate structure overlays a non-edge portion of the second semiconductor fin.

In another aspect of the present disclosure, a semiconductor device is disclosed. The semiconductor device includes a memory cell. The memory cell includes a first active region, a second active region, a third active region, and a four active region, wherein the first through four active regions each extend along a first direction. The memory cell includes a first dielectric fin, a second dielectric fin, and a third dielectric fin, wherein the first through third dielectric fins each extend along the first direction, and wherein the first dielectric fin is disposed between the first and second active regions, the second dielectric fin is disposed between the second and third active regions, and the third dielectric fin is disposed between the third and fourth active regions. The memory cell includes a first gate structure and a second gate structure, wherein the first and second gate structures both extend along a second direction perpendicular to the first direction, and wherein the first gate structure comprises a first portion, a second portion, and a third portion, and the second gate structure comprises a first portion, a second portion, and a third portion. The first and second portions of the first gate structure are separated by the first dielectric fin, and the second and third portions of the first gate structure are separated by the second dielectric fin. The first and second portions of the second gate structure are separated by the second dielectric fin, and the second and third portions of the second gate structure are separated by the third dielectric fin.

In yet another aspect of the present disclosure, a method for fabricating a semiconductor device is disclosed. The method includes forming a first semiconductor fin and a second semiconductor fin, wherein the first and second semiconductor fins both extend along a first direction. The method includes forming a dielectric fin disposed between the first and second semiconductor fins, wherein the dielectric fin also extends along the first direction and is taller than the first and second semiconductor fins. The method includes forming a gate structure extending along a second direction perpendicular to the first direction, wherein the gate structure comprises a first portion and a second portion. The first portion and the second portion are separated by the dielectric fin. The first portion of the gate structure overlays an edge portion of the first semiconductor fin, and the second portion of the gate structure overlays a non-edge portion of the second semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first semiconductor fin extending along a first direction;
a second semiconductor fin also extending along the first direction;
a dielectric fin disposed between the first and second semiconductor fins, wherein the dielectric fin also extends along the first direction; and
a gate structure extending along a second direction perpendicular to the first direction, the gate structure comprising a first portion and a second portion;
wherein a top surface of the dielectric fin is vertically above respective top surfaces of the first and second semiconductor fins, and the top surface of the dielectric fin is vertically aligned with respective top surfaces of the first and second portions of the gate structure;
wherein the first portion and the second portion are electrically and physically isolated by the dielectric fin; and
wherein the first portion of the gate structure overlays an edge portion of the first semiconductor fin, and the second portion of the gate structure overlays a non-edge portion of the second semiconductor fin.

2. The semiconductor device of claim 1, wherein the dielectric fin includes a plurality of dielectric structures.

3. The semiconductor device of claim 1, wherein the dielectric fin contains a continuously formed one-piece structure.

4. The semiconductor device of claim 1, wherein the first portion of the gate structure extends along a sidewall of the first semiconductor fin.

5. The semiconductor device of claim 4, further comprising a first epitaxial structure, in the first semiconductor fin, that is disposed opposite to the sidewall along the first direction.

6. The semiconductor device of claim 5, further comprising a second epitaxial structure and a third epitaxial structure, in the second semiconductor fin, that are disposed on opposite sides of the second portion of the gate structure along the first direction.

7. The semiconductor device of claim 6, wherein the first epitaxial structure functions as a drain of a first pull-up transistor of a Static Random Access Memory (SRAM) cell.

8. The semiconductor device of claim 7, wherein the second epitaxial structure is disposed opposite the dielectric fin from the first epitaxial structure along the second direction.

9. The semiconductor device of claim 8, wherein the second epitaxial structure functions as a drain of a second pull-up transistor of the SRAM cell, and the third epitaxial structure functions as a source of the second pull-up transistor of the SRAM cell.

10. A semiconductor device, comprising:
a first semiconductor fin extending along a first direction;
a second semiconductor fin also extending along the first direction;

a dielectric fin disposed between the first and second semiconductor fins, wherein the dielectric fin extends along the first direction and contains a continuously formed one-piece structure; and a gate structure extending along a second direction perpendicular to the first direction, the gate structure comprising a first portion and a second portion;

wherein a top surface of the dielectric fin is vertically above respective top surfaces of the first and second semiconductor fins, and the top surface of the dielectric fin is vertically aligned with respective top surfaces of the first and second portions of the gate structure;

wherein the first portion and the second portion are electrically and physically isolated by the dielectric fin; and wherein the first portion of the gate structure overlays an edge portion of the first semiconductor fin, and the second portion of the gate structure overlays a non-edge portion of the second semiconductor fin.

11. The semiconductor device of claim 10, wherein the first portion of the gate structure extends along a sidewall of the first semiconductor fin.

12. The semiconductor device of claim 11, further comprising a first epitaxial structure, in the first semiconductor fin, that is disposed opposite to the sidewall along the first direction.

13. The semiconductor device of claim 12, further comprising a second epitaxial structure and a third epitaxial structure, in the second semiconductor fin, that are disposed on opposite sides of the second portion of the gate structure along the first direction.

14. The semiconductor device of claim 13, wherein the first epitaxial structure functions as a drain of a first pull-up transistor of a Static Random Access Memory (SRAM) cell.

15. The semiconductor device of claim 14, wherein the second epitaxial structure functions as a drain of a second pull-up transistor of the SRAM cell.

16. The semiconductor device of claim 15, wherein the third epitaxial structure functions as a source of the second pull-up transistor of the SRAM cell.

17. A semiconductor device, comprising:

a first semiconductor fin extending along a first direction;

a second semiconductor fin also extending along the first direction;

a dielectric fin disposed between the first and second semiconductor fins, wherein the dielectric fin extends along the first direction and includes a plurality of dielectric structures; and a gate structure extending along a second direction perpendicular to the first direction, the gate structure comprising a first portion and a second portion;

wherein a top surface of the dielectric fin is vertically above respective top surfaces of the first and second semiconductor fins, and the top surface of the dielectric fin is vertically aligned with respective top surfaces of the first and second portions of the gate structure;

wherein the first portion and the second portion are electrically and physically isolated by the dielectric fin; and wherein the first portion of the gate structure overlays an edge portion of the first semiconductor fin, and the second portion of the gate structure overlays a non-edge portion of the second semiconductor fin.

18. The semiconductor device of claim 17, wherein the first portion of the gate structure extends along a sidewall of the first semiconductor fin.

19. The semiconductor device of claim 18, further comprising:

a first epitaxial structure, in the first semiconductor fin, that is disposed opposite to the sidewall along the first direction;

a second epitaxial structure, in the second semiconductor fin, that is disposed on a first side of the second portion of the gate structure along the first direction; and a third epitaxial structure, in the second semiconductor fin, that is disposed on a second, opposite side of the second portion of the gate structure along the first direction.

\* \* \* \* \*